United States Patent
Chang et al.

(10) Patent No.: US 10,859,645 B2
(45) Date of Patent: Dec. 8, 2020

(54) METHOD AND SYSTEMS FOR COIL SELECTION IN MAGNETIC RESONANCE IMAGING

(71) Applicant: General Electric Company, Schenectady, NY (US)

(72) Inventors: Shaorong Chang, Hartland, WI (US); Eric Printz, Oconomowoc, WI (US); Ling Sun, Brookfield, WI (US); Anja Kammeier, Milwaukee, WI (US); Charles Michelich, Brookfield, WI (US); Zachary Slavens, New Berlin, WI (US)

(73) Assignee: GENERAL ELECTRIC COMPANY, Schenectady, NY (US)

(*) Notice: Subject to any disclaimer, the term of this patent is extended or adjusted under 35 U.S.C. 154(b) by 243 days.

(21) Appl. No.: 15/995,051

(22) Filed: May 31, 2018

(65) Prior Publication Data
US 2019/0369180 A1 Dec. 5, 2019

(51) Int. Cl.
*G01R 33/36* (2006.01)
*G01R 33/58* (2006.01)
(Continued)

(52) U.S. Cl.
CPC ..... *G01R 33/3664* (2013.01); *G01R 33/0005* (2013.01); *G01R 33/0023* (2013.01); *G01R 33/443* (2013.01); *G01R 33/58* (2013.01)

(58) Field of Classification Search
CPC ............ G01R 33/3664; G01R 33/0005; G01R 33/0023; G01R 33/58; G01R 33/443
See application file for complete search history.

(56) References Cited

U.S. PATENT DOCUMENTS 6,717,406 B2 * 4/2004 Sodickson ......... G01R 33/3415
324/307
6,961,455 B2 11/2005 Ma et al.
(Continued)

FOREIGN PATENT DOCUMENTS

EP 2255214 B1 5/2017
WO 2009112987 A1 9/2009
(Continued)

OTHER PUBLICATIONS

Chang, S. et al., "Methods and Systems for Coil Selection in Magnetic Resonance Imaging," U.S. Appl. No. 15/995,012, filed May 31, 2018, 50 pages.
(Continued)

*Primary Examiner* — Reena Aurora
(74) *Attorney, Agent, or Firm* — McCoy Russell LLP

(57) ABSTRACT

Various methods and systems are provided for selecting coil elements of a plurality of coil elements of a radio frequency (RF) coil array for use in a magnetic resonance imaging (MRI) system. In one example, a method includes grouping the plurality of coil elements into receive elements groups (REGs) according to REGs information, generating channel sensitivity maps for the plurality of coil elements, generating REG sensitivity maps based on the REGs information and the channel sensitivity maps, labeling each REG as either selectable or not selectable based on the REG sensitivity maps, selecting one or more REGs from the selectable REGs based on the REG sensitivity maps and a region of interest (ROI), and scanning the ROI with the coil elements in the one or more selected REGs being activated and the coil elements not in any selected the other REGs being deactivated.

19 Claims, 15 Drawing Sheets

(51) Int. Cl.
*G01R 33/00* (2006.01)
*G01R 33/44* (2006.01)

(56) References Cited

U.S. PATENT DOCUMENTS

| | | | |
|---|---|---|---|
| 7,800,368 | B2 | 9/2010 | Vaughan et al. |
| 7,924,007 | B2 | 4/2011 | Arnold et al. |
| 8,188,738 | B2 | 5/2012 | Hori et al. |
| 8,488,860 | B2 | 7/2013 | Uchizono et al. |
| 8,502,535 | B2 | 8/2013 | Jurrissen et al. |
| 8,934,694 | B2 | 1/2015 | Chen et al. |
| 9,084,553 | B2 | 7/2015 | Warmuth |
| 9,395,431 | B2 | 7/2016 | Detsky et al. |
| 9,427,171 | B2 | 8/2016 | Gdaniec et al. |
| 9,655,522 | B2 | 5/2017 | Li et al. |
| 9,675,249 | B2 | 6/2017 | Miyazaki et al. |
| 9,678,189 | B2 | 6/2017 | Mekkaoui |
| 9,700,220 | B2 | 7/2017 | Miyazaki et al. |
| 9,760,979 | B2 | 9/2017 | Chen et al. |
| 9,835,705 | B2 | 12/2017 | Weingartner et al. |
| 9,846,215 | B2 | 12/2017 | Hamada et al. |
| 9,846,217 | B2 | 12/2017 | Lin |
| 9,874,620 | B2 | 1/2018 | Ahmad et al. |
| 9,886,745 | B2 | 2/2018 | Chen et al. |
| 2003/0132750 | A1 | 7/2003 | Machida et al. |
| 2005/0275402 | A1 | 12/2005 | Campagna |
| 2006/0087320 | A1 | 4/2006 | Machida et al. |
| 2006/0197633 | A1 | 9/2006 | Lee |
| 2007/0013375 | A1 | 1/2007 | Akao et al. |
| 2007/0164742 | A1 | 7/2007 | Bito et al. |
| 2007/0210793 | A1 | 9/2007 | Kiefer |
| 2008/0129298 | A1 | 6/2008 | Vaughan et al. |
| 2008/0211502 | A1 | 9/2008 | Arnold et al. |
| 2008/0290870 | A1* | 11/2008 | Misic ............... G01R 33/3415 324/318 |
| 2011/0006766 | A1 | 1/2011 | Jurrissen et al. |
| 2011/0103668 | A1 | 5/2011 | Uchizono et al. |
| 2014/0002083 | A1 | 1/2014 | Asaba et al. |
| 2014/0145717 | A1 | 5/2014 | Ozawa et al. |
| 2014/0300355 | A1* | 10/2014 | Fautz ..................... G01R 33/28 324/309 |
| 2015/0247911 | A1 | 9/2015 | Iwadate |
| 2015/0355303 | A1 | 12/2015 | Kuhara |
| 2016/0018489 | A1 | 1/2016 | Farivar-Mohseni |
| 2016/0198970 | A1 | 7/2016 | Liu et al. |
| 2016/0324427 | A1 | 11/2016 | Meyer et al. |
| 2017/0049355 | A1 | 2/2017 | Furudate |
| 2017/0089993 | A1 | 3/2017 | McKinnon et al. |
| 2017/0273578 | A1 | 9/2017 | Finn et al. |
| 2017/0328970 | A1 | 11/2017 | Bi et al. |
| 2017/0350953 | A1 | 12/2017 | Huang et al. |
| 2018/0059195 | A1 | 3/2018 | Lai et al. |
| 2019/0369180 | A1 | 12/2019 | Chang et al. |
| 2019/0369181 | A1 | 12/2019 | Chang et al. |
| 2019/0369198 | A1 | 12/2019 | Chang |

FOREIGN PATENT DOCUMENTS

| | | |
|---|---|---|
| WO | 2009112987 A8 | 9/2009 |
| WO | 2014084259 A1 | 6/2014 |

OTHER PUBLICATIONS

Chang, S., "Method and Systems for Coil Selection in Magnetic Resonance Imaging to Reduce Phase Wrap Artifact," U.S. Appl. No. 15/995,023, filed May 31, 2018, 50 pages.

Chang, S. et al., "Method and Systems for Coil Selection in Magnetic Resonance Imaging to Reduce Annefact Artifact," U.S. Appl. No. 15/995,059, filed May 31, 2018, 54 pages.

United States Patent and Trademark Office, Office Action Issued in U.S. Appl. No. 15/995,012, filed Apr. 8, 2020, 18 pages.

* cited by examiner

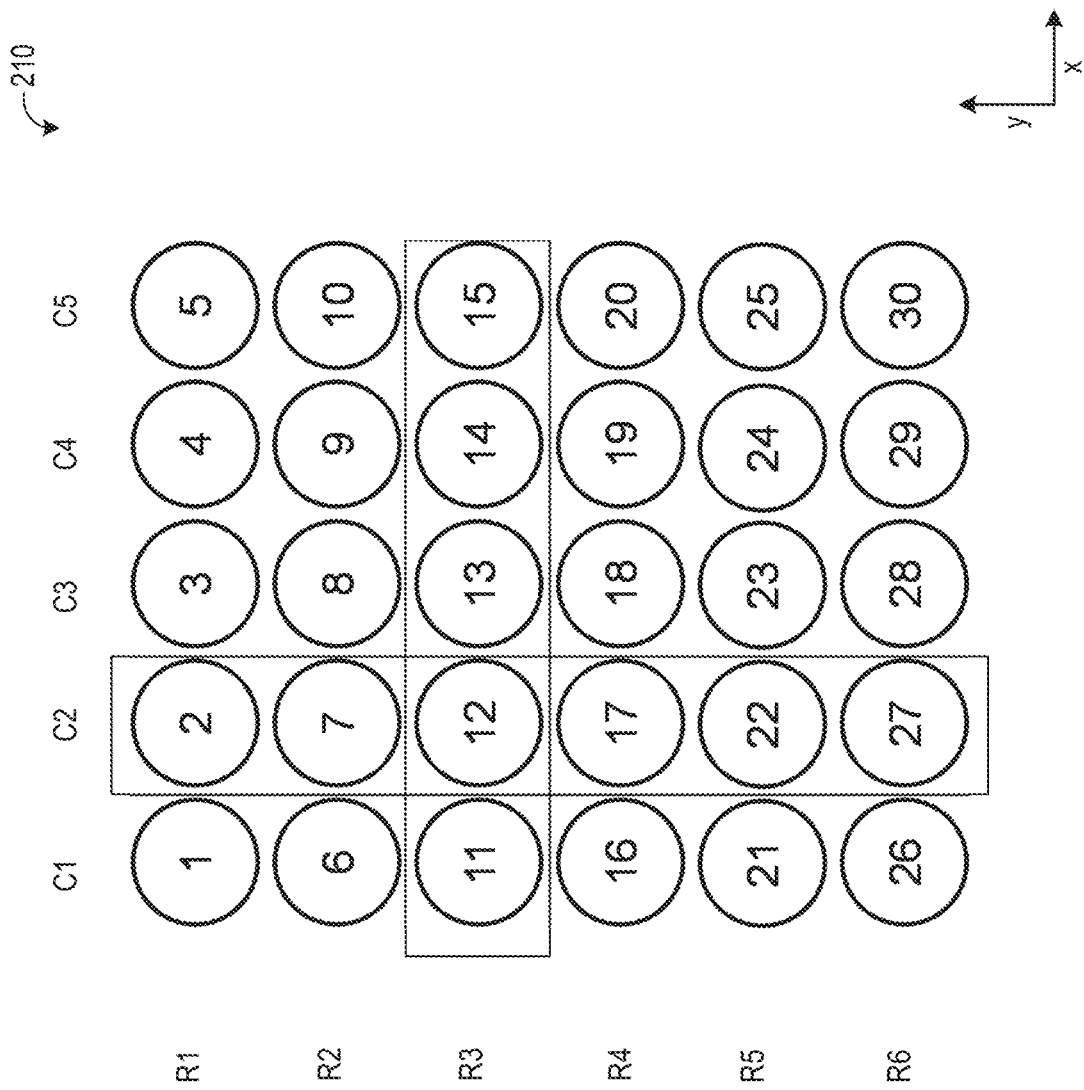

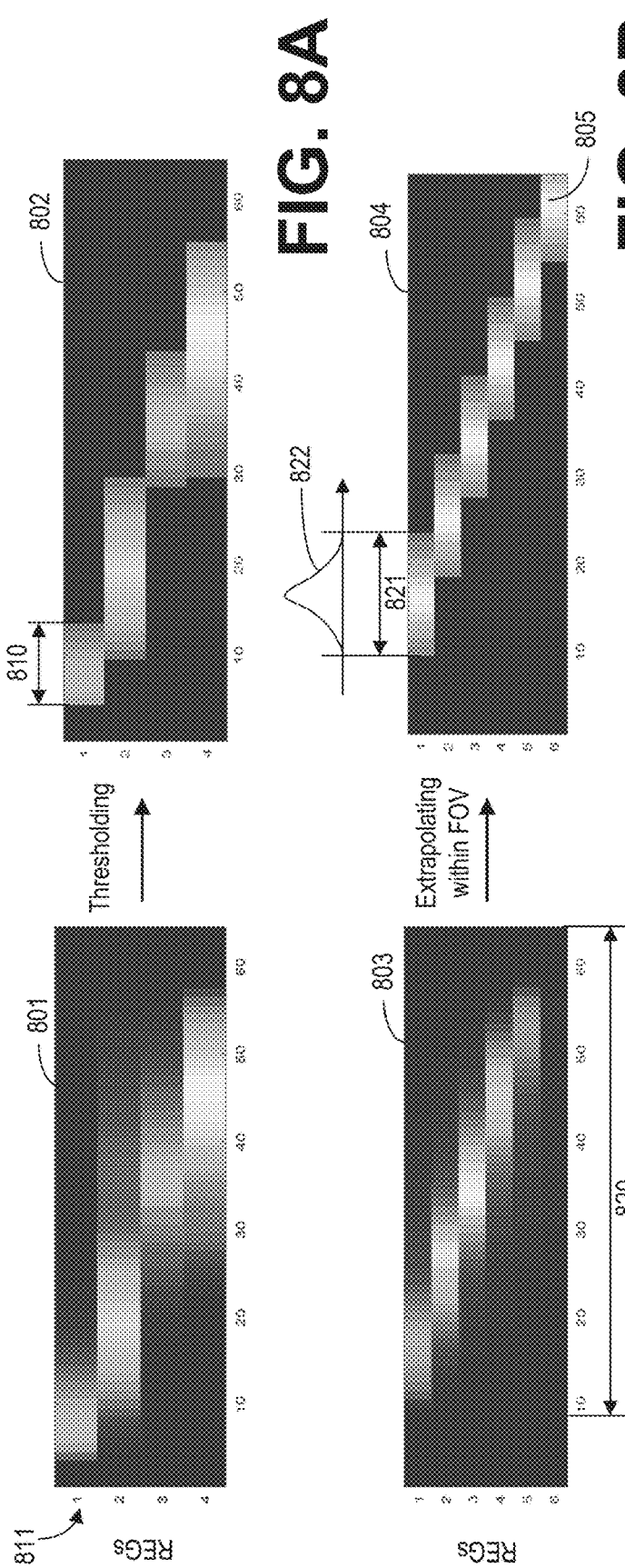
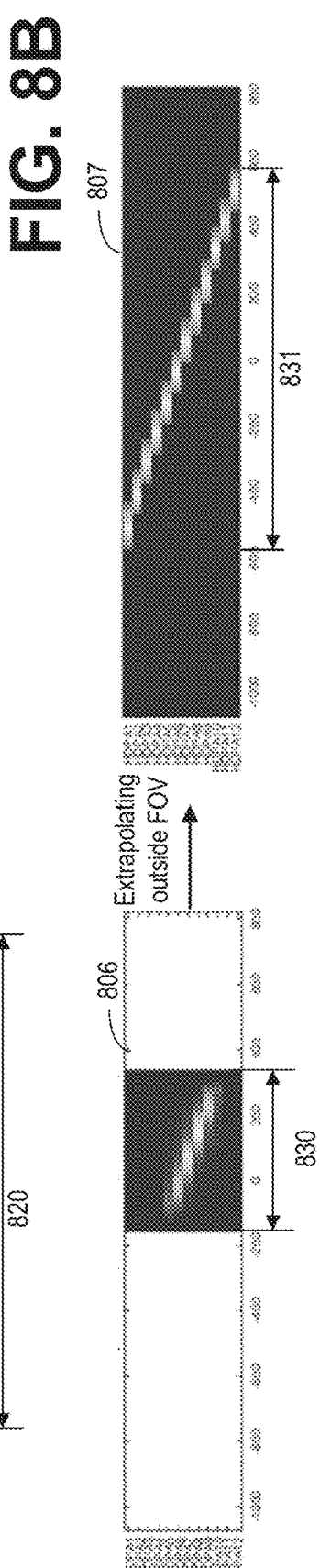

us 10,859,645 B2

METHOD AND SYSTEMS FOR COIL SELECTION IN MAGNETIC RESONANCE IMAGING

FIELD

Embodiments of the subject matter disclosed herein relate to magnetic resonance imaging, and more particularly, to selecting radio-frequency (RF) coil arrays during magnetic resonance imaging.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field $B_0$. When the human body, or part of the human body, is placed in the magnetic field $B_0$, the nuclear spins associated with the hydrogen nuclei in tissue water become polarized, wherein the magnetic moments associated with these spins become preferentially aligned along the direction of the magnetic field $B_0$, resulting in a small net tissue magnetization along that axis. MRI systems also include gradient coils that produce smaller amplitude, spatially-varying magnetic fields with orthogonal axes to spatially encode the magnetic resonance (MR) signal by creating a signature resonance frequency at each location in the body. The hydrogen nuclei are excited by a radio frequency signal at or near the resonance frequency of the hydrogen nuclei, which add energy to the nuclear spin system. As the nuclear spins relax back to their rest energy state, they release the absorbed energy in the form of an RF signal. This RF signal (or MR signal) is detected by one or more RF coil arrays and is transformed into the image using a computer and known reconstruction algorithms.

In some examples, the RF coil arrays used to receive the MR signals may be local or surface RF coil arrays that may be placed on or over an imaging subject. Such coil arrays may be adjustable in size, position, and/or orientation. For example, based a given imaging objective, an operator may position a selected surface RF coil array over an imaging subject and plug the RF coil array into the MRI system. Depending on the configuration of the RF coil array and size of the imaging subject, the operator may position the RF coil array in a first orientation or in a second orientation that is rotated relative to the first orientation.

BRIEF DESCRIPTION

In one embodiment, a method for magnetic resonance imaging (MRI) with a receive radio frequency (RF) coil array comprising a plurality of coil elements is presented. The method includes grouping the plurality of coil elements into receive elements groups (REGs) according to REGs information, generating channel sensitivity maps for the plurality of coil elements, generating REG sensitivity maps based on the REGs information and the channel sensitivity maps, labeling each REG as either selectable or not selectable based on the REG sensitivity maps, selecting one or more REGs from the selectable REGs based on the REG sensitivity maps and a region of interest (ROI), and scanning the ROI with the coil elements in the one or more selected REGs being activated and the coil elements not in any selected other REGs being deactivated.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIG. 2B schematically illustrates an example RF coil array.

FIGS. 8A-8C shows example REG sensitivity maps.

DETAILED DESCRIPTION

Figure 1:
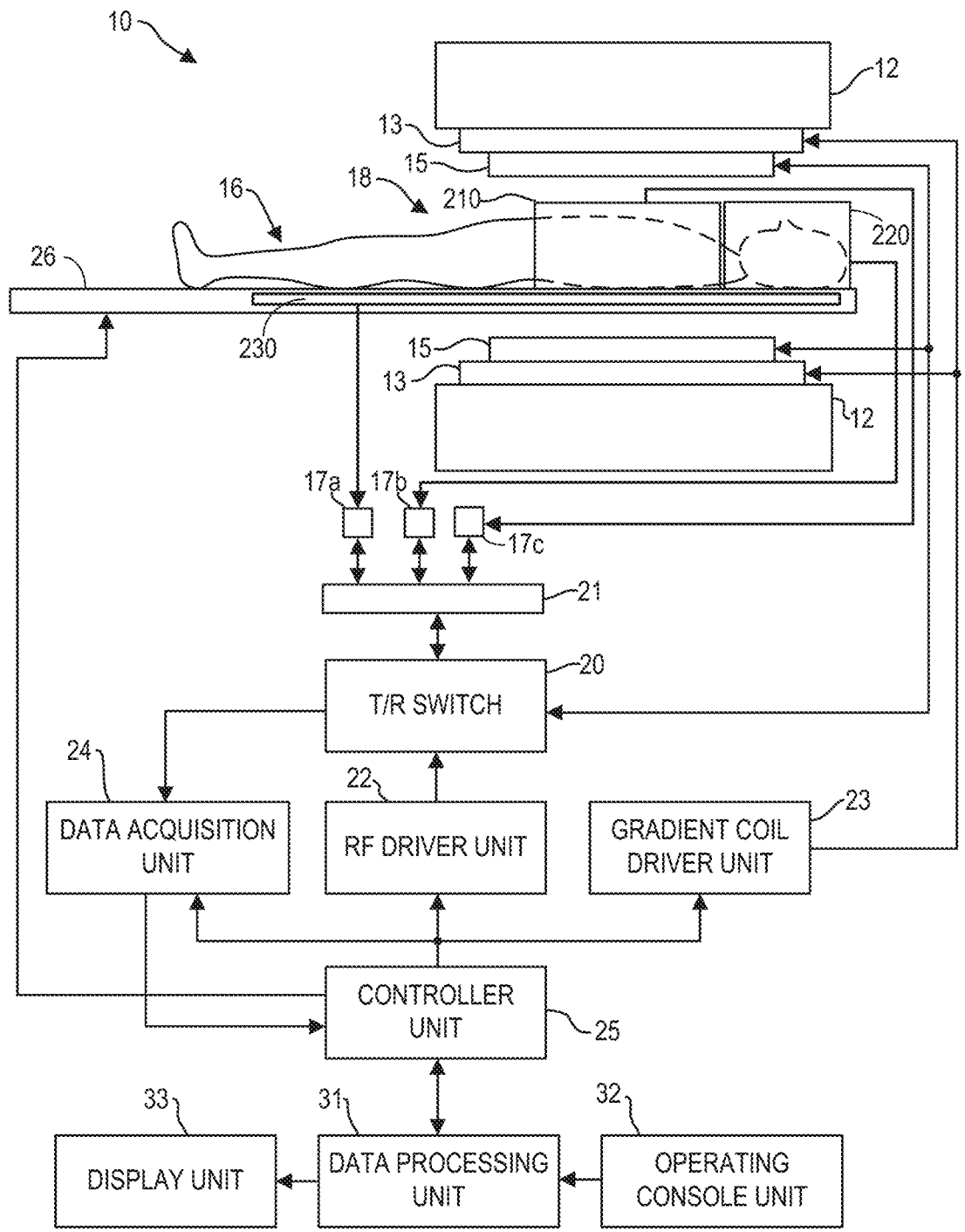
FIG. 1 is a block diagram of an MRI system according to an embodiment.
Figure 2A:
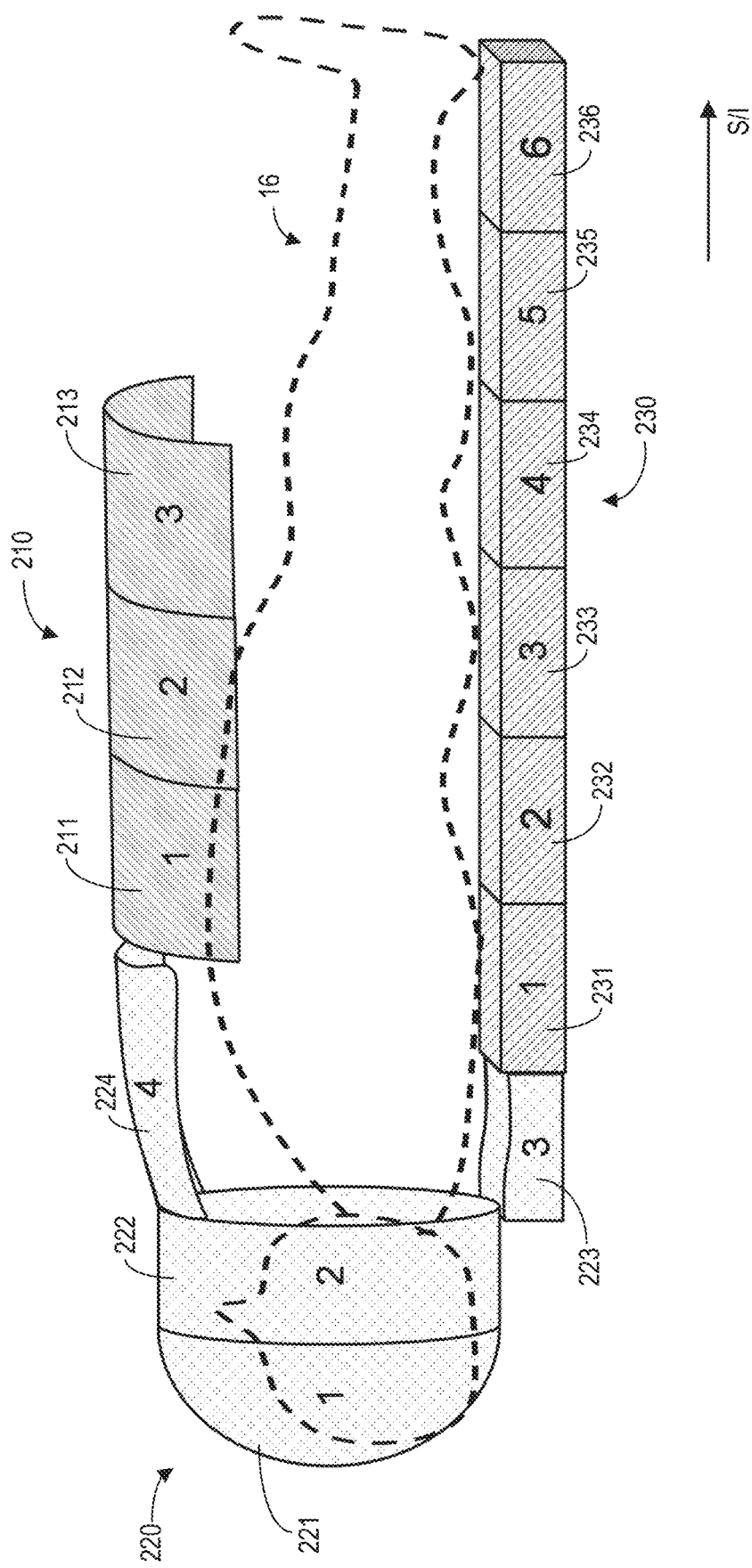
FIG. 2A is an example arrangement of RF coil arrays relative to an imaging subject.

The following description relates to various embodiments of automatic radio frequency (RF) coil element selection during magnetic resonance imaging (MRI) in an MRI system, such as the MRI apparatus depicted in FIG. 1. As shown in FIG. 2A, a plurality of RF coil arrays, such as the RF coil array of FIG. 2B, may be arranged around a patient's body, and each RF coil array may include a plurality of coil elements. Each coil element is configured to send MR signals to the MRI system, via a channel of a plurality of channels, for eventual processing into an image. The sensitivity of each coil element to the MR signals emitted by the imaging subject depends on the distance of the coil element from the source of the MR signal. As the RF coil array may be deformable, and the operator may position surface RF coil arrays differently for different imaging subjects and/or imaging objectives, coil elements having high sensitivity to the MR signals may change from scan to scan. Coil elements located outside of an imaging region of interest may pick up signals that do not contribute to the reconstructed image, but instead contribute noise, compromising image quality.

Figure 3:
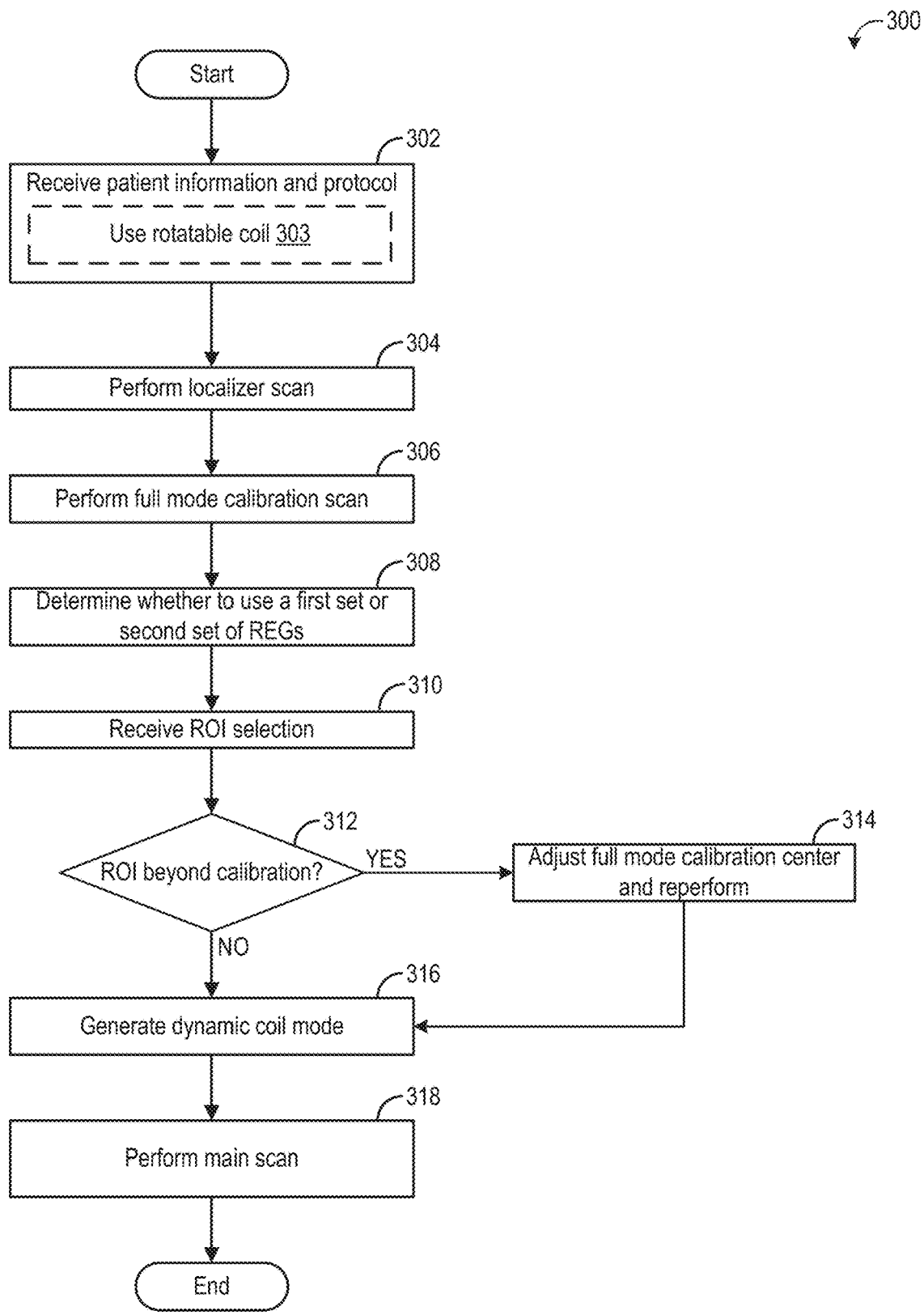
FIG. 3 is flow chart illustrating an example method for selecting coil elements of an RF coil array for an MRI scan.
Figure 5:
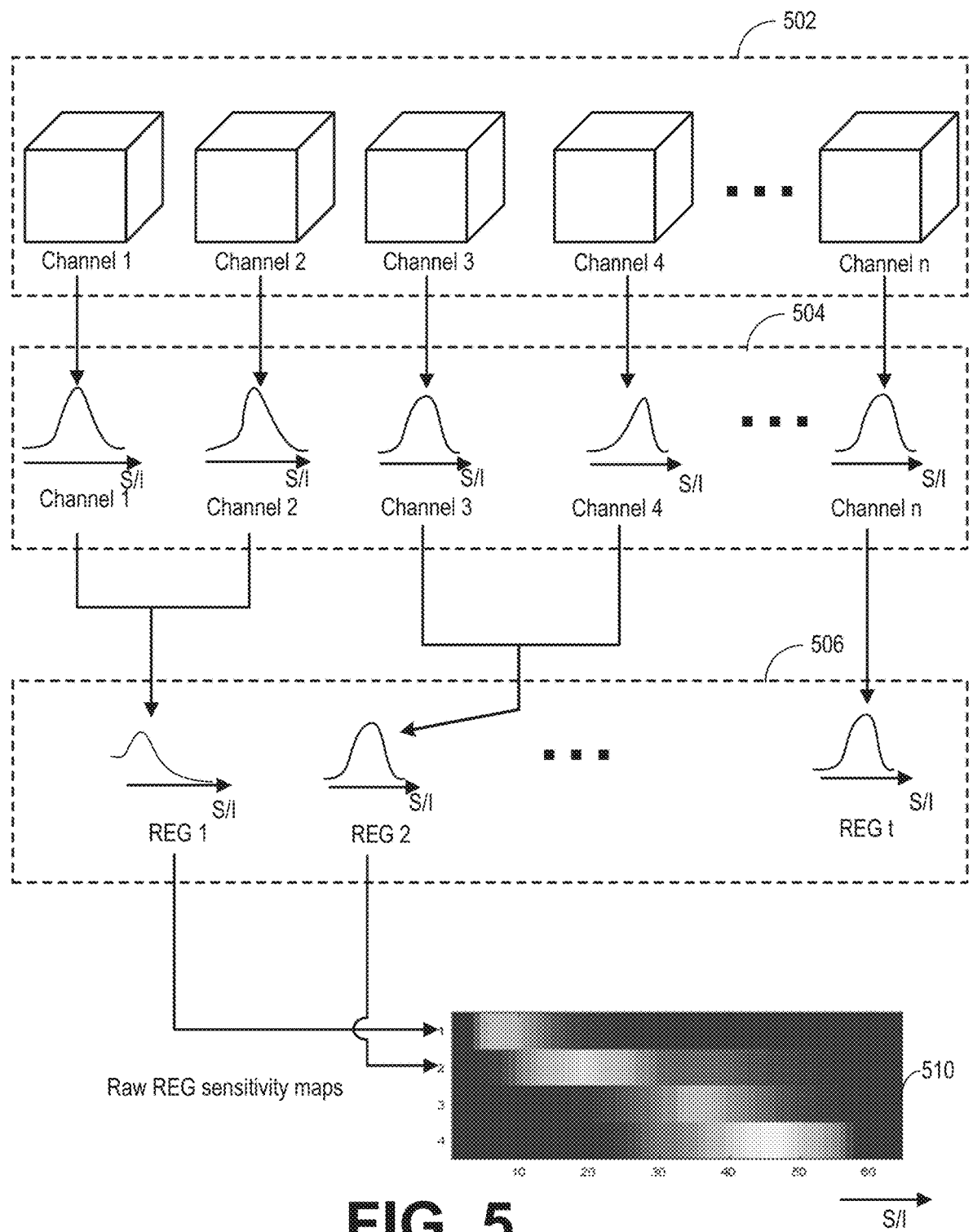
FIG. 5 illustrates the data processed by the subroutine of FIG. 4.
Figure 6:
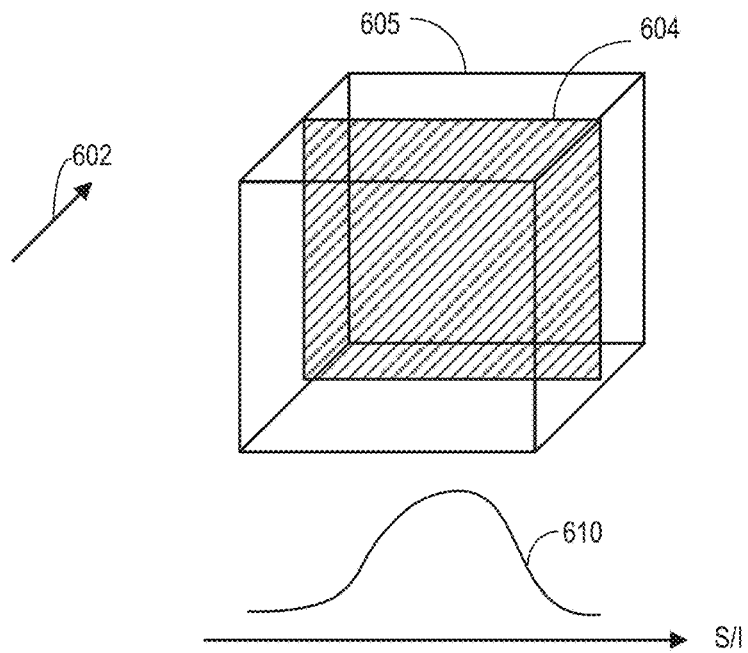
FIG. 6 schematically illustrates an example projection of calibration data to generate a channel sensitivity map.
Figure 11:
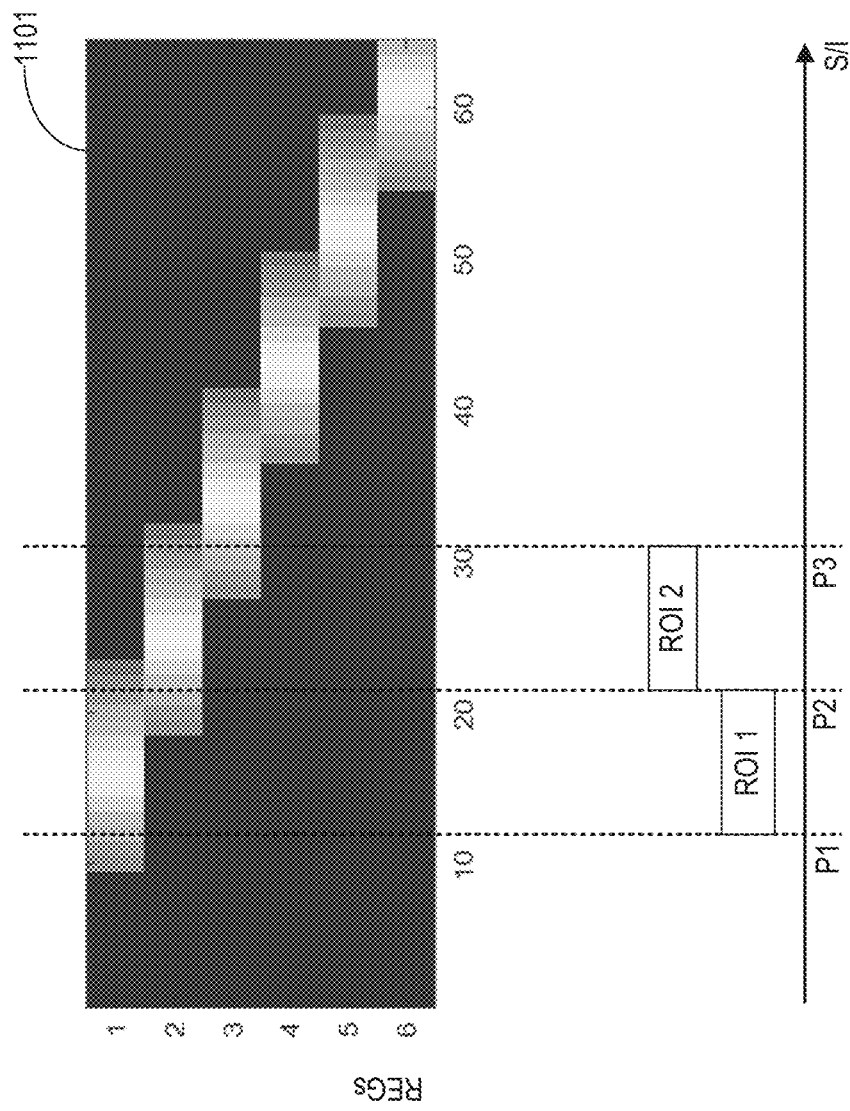
FIG. 11 schematically shows an example process for selecting REGs to be included in a dynamic coil mode.

Thus, according to embodiments disclosed herein, selected coil elements may be automatically selected based on a sensitivity of each coil element to MR signals as determined from low resolution imaging data acquired during a calibration scan relative to an operator-defined region of interest (ROI), as shown by the method illustrated in FIG. 3. As will be explained in more detail below, the low resolution imaging data is projected onto one dimension to generate a channel sensitivity map for each channel, as shown in FIG. 6, and the channel sensitivity maps are combined according to various groupings of coil elements, referred to as receive element groups (REGs), to generate one or more REG sensitivity maps, as shown by the method illustrated in FIG. 4 and schematically illustrated in FIG. 5. The raw REG sensitivity map(s) may be processed according the method of FIG. 7 in order to generate processed REG sensitivity maps as shown in FIGS. 8A-8C. The processed REG sensitivity map(s) may be used to identify one or more REGs to be used in a main scan for acquiring MR data that is used to reconstruct one or more images, as schematically shown in FIG. 11.

Figure 9:
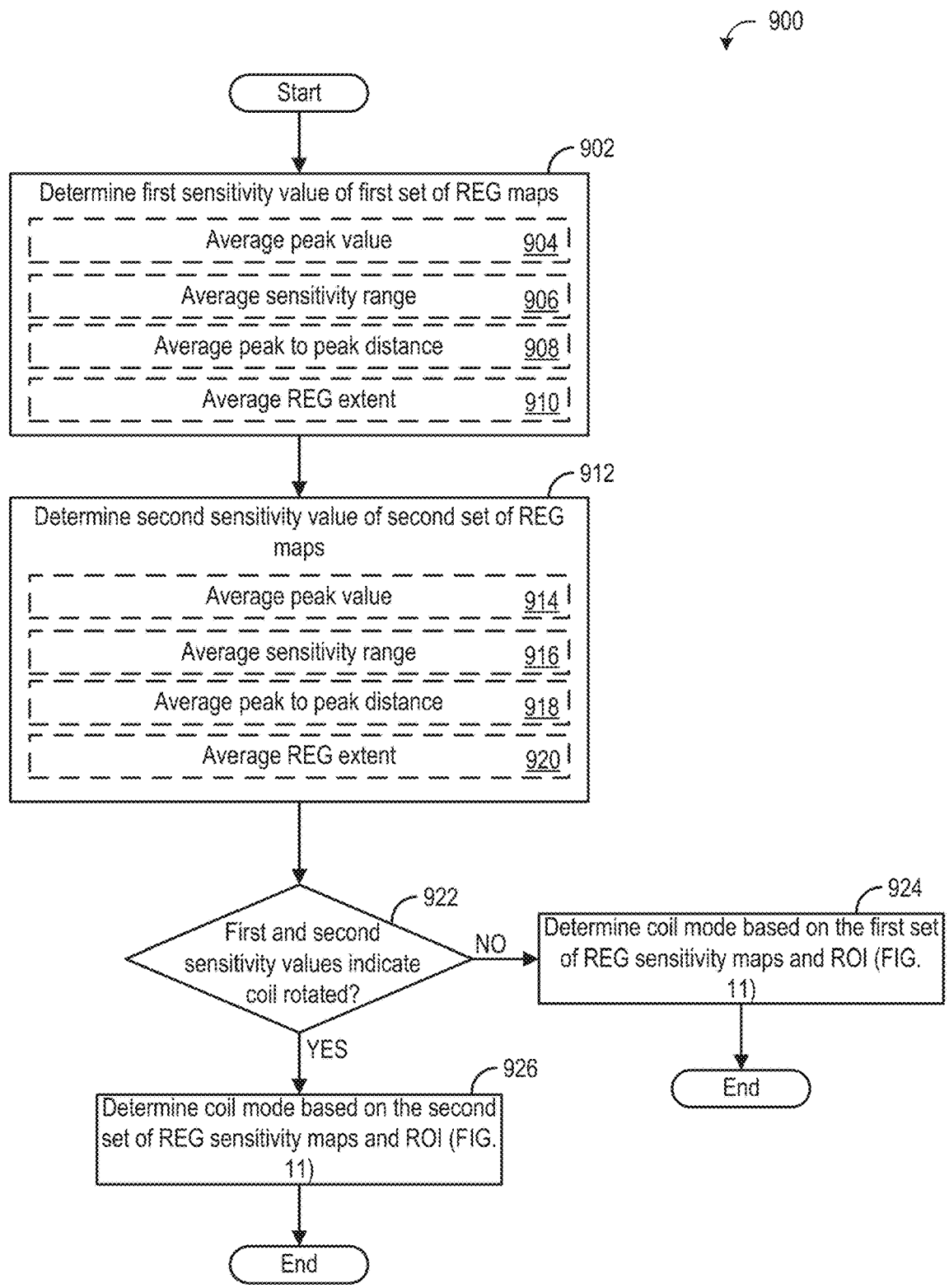
FIG. 9 illustrates an example method for determining an orientation of an RF coil array.
Figure 10:
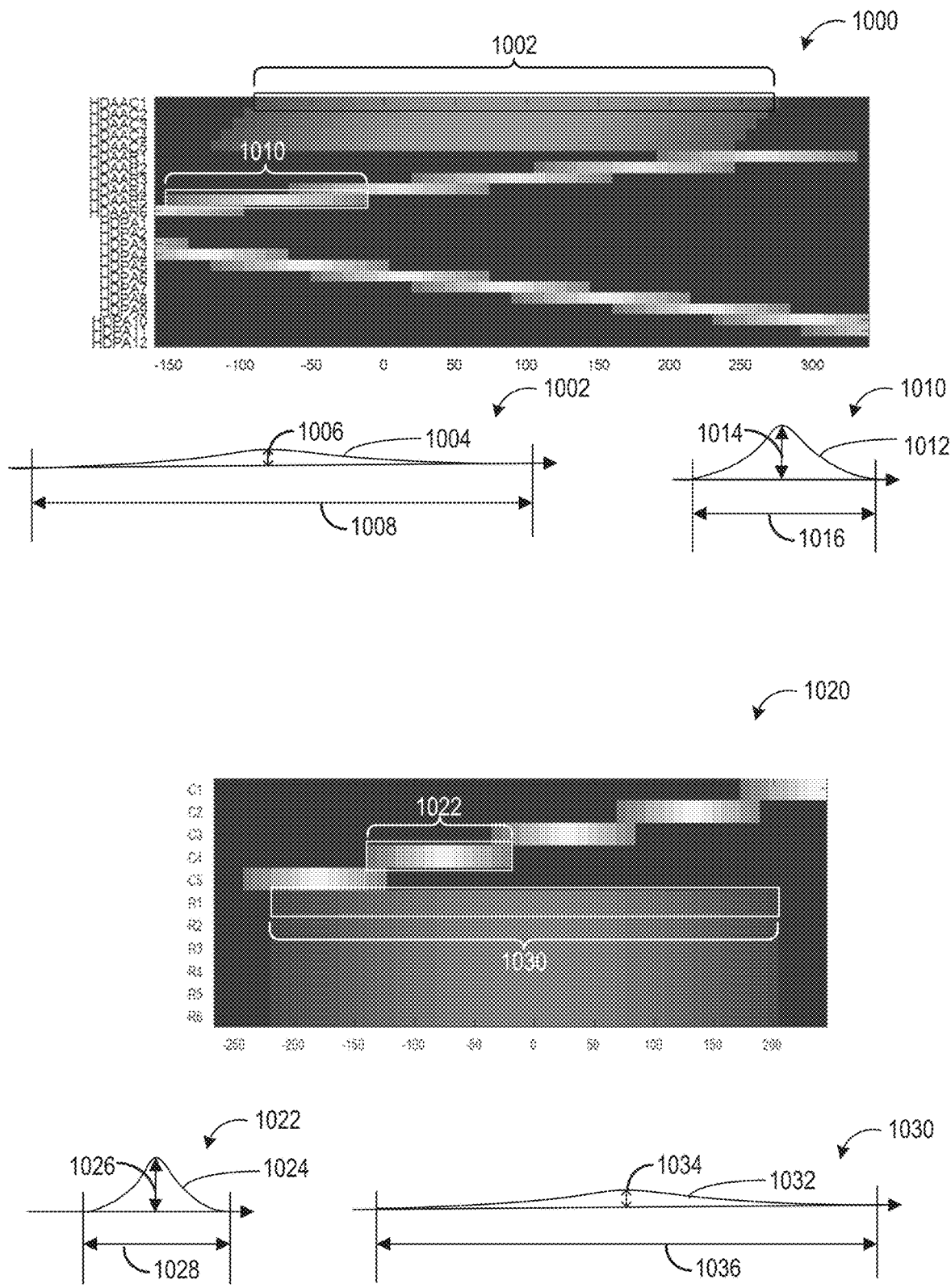
FIG. 10 illustrates example REG sensitivity maps for non-rotated and rotated coil orientations.

Further, the sensitivity of each coil element may be used to automatically determine an orientation of the RF coil array, as shown by the method of FIG. 9. When the RF coil array is in a first orientation where the coil elements of a given REG extend along a first axis (e.g., a medial-lateral axis), when the low resolution imaging data is combined for the coil elements of the given REG, the resulting REG sensitivity may be relatively high and of narrow extent in a second axis that is perpendicular to the first axis (e.g., the superior-inferior axis). However, if the RF coil array is in a second orientation that is rotated 90° relative to the first orientation, when the low resolution imaging data is combined for the coil elements of the given REG, the resulting REG sensitivity may be relatively low and of wide extent in the second axis, due to the fact that the coil elements of the given REG actually extend along the second axis. Example REG sensitivity maps for an RF coil array in a first orientation and in a second orientation are shown in FIG. 10.

Additionally, some imaging protocols dictate that a large area/length of the imaging subject be imaged, where the desired imaging region of the imaging subject is larger than the MRI system field of view. During such imaging protocols, referred to herein as full body scans, the table of the MRI system may be moved through multiple positions, or stations, and a main imaging scan performed at each station. The coil selection process described above may be performed at each station, according to the methods illustrated in FIG. 12 and FIG. 14 and the timeline/processes illustrated in FIG. 13 and FIG. 15.

FIG. 1 illustrates a magnetic resonance imaging (MRI) apparatus 10 that includes a magnetostatic field magnet unit 12, a gradient coil unit 13, one or more local RF coil arrays (210, 220, and 230), an RF body coil unit 15, a transmit/receive (T/R) switch 20, an RF port interface 21, an RF driver unit 22, a gradient coil driver unit 23, a data acquisition unit 24, a controller unit 25, a patient bed 26, a data processing unit 31, an operating console unit 32, and a display unit 33. The MRI apparatus 10 transmits electromagnetic pulse signals to a subject 16 placed in an imaging space 18 with a magnetostatic field formed to perform a scan for obtaining magnetic resonance (MR) signals from the subject 16 to reconstruct an image of the slice of the subject 16 based on the MR signals thus obtained by the scan.

The magnetostatic field magnet unit 12 includes, for example, typically an annular superconducting magnet, which is mounted within a toroidal vacuum vessel. The magnet defines a cylindrical space surrounding the subject 16, and generates a constant primary magnetostatic field $B_0$.

The MRI apparatus 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field which inclines into one of three spatial axes perpendicular to each other, and generates a gradient field in each of frequency encoding direction, phase encoding direction, and slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

Three local RF coil arrays 210, 220, and 230 are shown herein. The local RF coil arrays are disposed, for example, to enclose the region to be imaged of the subject 16. In the static magnetic field space or imaging space 18 where a static magnetic field $B_0$ is formed by the magnetostatic field magnet unit 12, the local RF coil arrays may transmit, based on a control signal from the controller unit 25, an RF pulse that is an electromagnet wave to the subject 16 and thereby generates a high-frequency magnetic field $B_1$. This excites a spin of protons in the slice to be imaged of the subject 16. The local RF coil arrays receive, as a MR signal, the electromagnetic wave generated when the proton spin returns into alignment with the initial magnetization vector. In one embodiment, the local RF coil may transmit and receive an RF pulse using the same local RF coil. In another embodiment, the local RF coil may be used for only receiving the MR signals, but not transmitting the RF pulse. Details of the local RF coil arrays are presented in FIG. 2.

The RF body coil unit 15 is disposed, for example, to enclose the imaging space 18, and produces RF magnetic field pulses $B_1$ orthogonal to the main magnetic field $B_0$ produced by the magnetostatic field magnet unit 12 within the imaging space 18 to excite the nuclei. In contrast to the local RF coil arrays (such as local RF coil arrays 210 and 220), which may be easily disconnected from the MR apparatus 10 and replaced with another local RF coil, the RF body coil unit 15 is fixedly attached and connected to the MR apparatus 10. Furthermore, whereas coil arrays can transmit to or receive signals from only a localized region of the subject 16, the RF body coil unit 15 generally has a larger coverage area and can be used to transmit or receive signals to the whole body of the subject 16. Using receive-only RF coil arrays and transmit body coils provides a uniform RF excitation and good image uniformity at the expense of high RF power deposited in the subject. For a transmit-receive RF coil array, the coil array provides the RF excitation to the region of interest and receives the MR signal, thereby decreasing the RF power deposited in the subject. It should be appreciated that the particular use of the local RF coil arrays and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect one or more of the local RF coil arrays to the data acquisition unit 24 when the local RF coil arrays operate in receive mode, and to the RF driver unit 22 when operating in transmit mode. When the local RF coil arrays and the RF body coil unit 15 are both used in a single scan, for example if the local RF coil arrays are configured to receive MR signals and the RF body coil unit 15 is configured to transmit RF signals, then the T/R switch 20 may direct control signals from the RF driver unit 22 to the RF body coil unit 15 while directing received MR signals from the local RF coil arrays to the data acquisition unit 24. The RF body coil unit 15 may be configured to operate in a transmit-only mode, a receive-only mode, or a transmit-receive mode. The local RF coil arrays may be configured to operate in a transmit-receive mode or a receive-only mode.

The RF driver unit 22 includes a gate modulator (not shown), an RF power amplifier (not shown), and an RF oscillator (not shown) that are used to drive the RF coil arrays and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil arrays.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a preamplifier (not shown), a phase detector (not shown), and an analog/digital converter (not shown) used to acquire the MR signals received by the local RF coil arrays. In the data acquisition unit 24, the phase detector phase detects, using the output from the RF oscillator of the RF driver unit 22 as a reference signal, the MR signals received from the RF coil arrays and amplified by the preamplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25. One or more of the RF coil arrays may be coupled to the table 26 and moved together with the table.

The controller unit 25 includes a computer and a recording medium on which a program to be executed by the computer is recorded, in some embodiments. The program when executed by the computer causes various parts of the apparatus to carry out operations corresponding to predetermined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image of the subject 16 generated by the data processing unit 31.

Different RF coil arrays may be utilized for different scanning objectives. To that end, one or more the RF coil arrays, such as RF coil array 210, may be disconnected from the MRI apparatus 10, so that a different coil array may be connected to the MRI apparatus 10. The RF coil arrays may be coupled to the T/R switch 20, and thus to the RF driver unit 22 and the data acquisition unit 24, via a connector and an RF port interface 21. Each RF coil array may be electrically coupled to one or more connectors (such as connector 17*a*-17*c*). The connector(s) may be plugged into the RF port interface 21 to electronically couple the RF coil array to the T/R switch 20. For example, coil array 210 may be electronically coupled to the MRI apparatus 10 by plugging connector 17*c* into RF port interface 21. As such, the local RF coil arrays may be easily changed.

FIG. 2A shows an example arrangement of RF coil arrays of the MRI apparatus 10 of FIG. 1 relative to the subject 16. In particular, an anterior coil array 210, a head-neck coil array 220, and a posterior coil array 230 are positioned on top of the body, over the head-neck, and under the body, respectively. Each coil array is an individual piece and may be physically separated from each other. One or more of the coil arrays (such as the anterior coil array 210 and head-neck coil 220) may be connected to or removed from the MRI apparatus 10 by the operator. The posterior coil array 230 may be embedded within and moved together with table 26. Each coil array may include one or more coil elements, and each coil element receives MR signals generated from a specific volume of the subject 16. The coil elements may or may not overlap with each other. For example, the anterior coil array 210 includes three rows of coil elements (211-213) arranged along the superior to inferior (S/I) direction. Each row (211, 212, 213) may include multiple (e.g., 4, 5, 6, 7, 8, etc.) coil elements along the direction perpendicular to the S/I direction. The head coil array 220 includes four rows of coil elements (221-224) to cover different surface area of the subject; and the posterior coil array 230 includes six rows of coil elements (231-236) arranged along the S/I direction. In some embodiments, the relative position among the coil elements of a coil array may be fixed with respect to each other. In some embodiments, the relative position among the coil elements of a coil array may be variable relative to each other.

The coil elements of one coil array or coil elements from multiple coil arrays may be grouped into receive element groups (REGs) according to REGs information. The REGs information is predetermined rules for grouping coil elements of the coil array for transmitting and/or receiving MR signals. Different REGs include different combinations of coil elements. A coil element may be included in more than one REG. The REGs information may be determined based on the imaging objective, geometry of the coil array, hardware limitation (e.g., multiple coil elements must be turned on/off at the same time), and so on. The REGs information may further provide exclusive REGs. For example, when one coil element is included in two REGs, the two REGs are exclusive of each other, meaning that they cannot be selected at the same time.

Take anterior coil array 210 as an example. All coil elements in the anterior coil array 210 may be grouped as a first REG. Coil elements in row 211 may be grouped as a second REG; coil elements in row 212 may be grouped as a third REG; and coil elements in row 213 can be grouped as a fourth REG. Coil elements in a column (along the direction perpendicular to the rows) may be grouped as a fifth REG. The first REG and the second REG are exclusive of each other because they both include coil elements in row 211. The second REG and the fifth REG are exclusive of each other because they both include a coil element at the cross of row 212 and the column, and so on. REGs of the posterior coil array 230 may be defined similarly. As another example, coil elements in rows 223 and 224 of the head-neck coil array 220 may be grouped as one neck-piece REG. In some embodiments, each coil element may represent a separate REG. The REGs information may be saved in the memory of the MRI apparatus 10.

Each coil element of the coil arrays is electronically coupled to the controller unit (such as controller unit 25 of FIG. 1) via a channel. In particular, each coil element can sense the MR signals and transfer the MR signal to the data acquisition unit (such as data acquisition unit 24 of FIG. 1) of the MRI apparatus via the corresponding channel. The data acquisition unit then outputs digitized MR signals to the controller unit. As such, the channels of the coil arrays may also be grouped according to the REGs information. In some examples, each individual coil element may be coupled to one channel, and each channel may only be coupled to one coil element (e.g., anterior coil array 210 may include 12 coil elements coupled to the data acquisition unit via 12 separate channels). In other examples, more than coil element may be coupled to a given channel (e.g., anterior coil array 210 may include 12 coil elements coupled to the data acquisition unit via 6 separate channels).

An example of RF coil array 210 shown in a top-down view is illustrated in FIG. 2B. RF coil array 210 comprises a plurality of RF coil elements arranged in an array. Herein, RF coil array 210 includes 30 coil elements arranged in an array of six rows (R1-R6) and five columns (C1-C5). However, other configurations are possible, such as the array including six rows and five columns, an array of fifteen coil elements arranged in an array of five rows by three columns, or any other appropriate configuration. Each coil element (numbered as coil elements 1-30 in FIG. 2B) may include a distributed capacitance loop portion and may be coupled to a controller unit via a respective coupling electronics portion and coil interfacing cable (not shown in FIG. 2B), or may be of any other suitable configuration.

The RF coil array 210 is illustrated in a first orientation whereby each of the rows of coil elements extend along a first direction, e.g., parallel to the x axis of the coordinate system of FIG. 2B, and each of the columns extend along a second direction, e.g., parallel to the y axis of the coordinate system. During imaging, an operator may position the RF coil array 210 over a patient in the first orientation, such that each of columns C1-C5 extends along the superior-inferior (S/I) axis of the patient each of the rows R1-R6 extends perpendicular to the S/I axis of the patient. However, depending on the patient size and imaging objective, the operator may instead place the RF coil array 210 in a second orientation where the RF coil array 210 is rotated 90° relative to the first orientation. In the second orientation, the rows now extend along the second direction (e.g., parallel to the y axis) and the columns extend along the first direction (e.g., parallel to the x axis). As such, during imaging, each of the rows R1-R6 extends along the S/I axis of the patient and each of the columns C1-C5 extends perpendicular to the S/I axis of the patient.

In order to obtain high quality images that have a desired signal to noise ratio, the RF coil array 210 is configured to be arranged into groups of coil elements (e.g., the REGs as described above) that are collectively activated to obtain MR signals during an MR scan. By doing so, if an imaging protocol is selected that allows for selected deactivation of coil elements positioned outside a scanning region of interest (ROI), the coil elements that are located within the ROI will be activated according to the REG grouping in order to maintain desired signal to noise ratio. RF coil array 210, while in the first orientation, may include a first set of REGs, each REG corresponding to a row of coil elements. For example, the first row of coil elements (R1) may define a first REG including coil elements 1-5, the second row of coil elements (R2) may define a second REG including coil elements 6-10, the third row of coil elements (R3) may define a third REG including coil elements 11-15, the fourth row of coil elements (R4) may define a fourth REG including coil elements 16-20, the fifth row of coil elements (R5) may define a fifth REG including coil elements 21-25, and the sixth row of coil elements (R6) may define a sixth REG including coil elements 26-30.

However, if the RF coil array 210 is positioned on an imaging subject in the second orientation, the first set of REGs defined above no longer extend along the x axis and instead extend along y axis. Thus, coil elements of the RF coil array 210 are configured to be additionally grouped into a second set of REGs, each REG corresponding to a column of coil elements. For example, the first column of coil elements (C1) may define a seventh REG including coil elements 1, 6, 11, 16, 21, and 26, the second column of coil elements (C2) may define an eighth REG including coil elements 2, 7, 12, 17, 22, and 27, the third column of coil elements (C3) may define a ninth REG including coil elements 3, 8, 13, 18, 23, and 28, the fourth column (C4) may define a tenth REG including coil elements 4, 9, 14, 19, 24, and 29, and the fifth column (C5) defines an eleventh REG including coil elements 5, 10, 15, 20, 25, and 30.

In some examples, RF coil array 210 may include distributed capacitance wire conductors rather than copper traces on PCBs with lumped electronic components. As a result, the RF coil array may be lightweight and flexible, allowing placement in low cost, lightweight, waterproof, and/or flame retardant fabrics or materials. The coupling electronics portion coupling the loop portion of the RF coil (e.g., the distributed capacitance wire) may be miniaturized and utilize a low input impedance pre-amplifier, which is optimized for high source impedance (e.g., due to impedance matching circuitry) and allows flexible overlaps among coil elements in an RF coil array. Further, the RF coil array interfacing cable between the RF coil array and system processing components may be flexible and include integrated transparency functionality in the form of distributed baluns, which allows rigid electronic components to be avoided and aids in spreading of the heat load.

FIG. 3 shows an example method 300 for performing a scan using an MRI system (such as the MRI apparatus 10 of FIG. 1) including a surface RF coil array (such as RF coil array 210) with a dynamic coil mode determined based on a calibration scan executed before a main scan and an automatically-determined orientation of the RF coil array. In particular, the coil elements used for receiving MR signals in the main scan are selected based on their sensitivity relative to a scanning region of interest (ROI). During the calibration scan, a dataset is acquired from each coil element of the RF coil array. The sensitivity of each element is determined by projecting each respective dataset along a coil selection direction to obtain a channel sensitivity map for each channel. The channel sensitivity maps are then combined into two sets of REG sensitivity maps based on the REGs groupings and the ROI. For example, a first set of REG sensitivity maps may be generated for the RF coil array with the coil elements grouped into the first set of REGs (e.g., where the REGs are rows of the RF coil array) and a second set of REG sensitivity maps may be generated for the RF coil array with the coil elements grouped into the second set of REGs (e.g., where the REGs are columns of the RF coil array).

The first and second sets of REG sensitivity maps may be compared to determine the orientation of the RF coil array. The row versus column REG groupings may assume the RF coil array is in the first orientation shown in FIG. 2B. However, if the RF coil array is rotated 90° relative to the first orientation, the rows become columns and vice versa. By comparing sensitivity values of each of the sets of REG sensitivity maps, the coil orientation may be determined. The set of REG sensitivity maps that corresponds to the determined coil orientation may then be selected for comparison to the scanning ROI. The extent of REG sensitivity in the set of REG sensitivity maps relative to the ROI determines the selection of one or more REGs for the main scan. Method 300 may be executed by controller unit 25 of FIG. 1 according to instructions stored in non-transitory memory.

At 302, method 300 includes receiving patient information and a scanning protocol. For example, an operator of the MRI system may input a patient identifier, such as code or the patient's name, and/or the operator may input select information about the patient (e.g., date of birth, age, gender, body weight). Further, the operator may select a predetermined scanning protocol from a menu or the operator may input various scanning parameters to set the scanning protocol. The scanning protocol may indicate the anatomy to be scanned, diagnostic goal of the scan, and/or other parameters that the MRI system may use to identify table position, which receive RF coil arrays are to be used during the scan (e.g., a head and neck RF coil array, posterior RF coil array, and/or anterior RF coil array), and other scanning parameters. In particular, the operator may select the protocol based on the anatomy that is going to be scanned. By selecting a protocol, a field of view (FOV) may be determined correspondingly. The FOV defines a three-dimensional volume of the patient. In one example, the FOV defines the volume that is going to be scanned for the localizer scan and the calibration scan (described in more detail below). For example, in cardiac imaging, the FOV is a cube with 20 cm long edges to cover the entire heart. In some examples, the FOV may include an entirety of the imaging subject/MRI bore volume that the MRI system is capable of imaging without moving the table on which the imaging subject is placed.

Responsive to the operator's input, the MRI system may move the table (such as table 26 of FIG. 1) to position the subject (such as a patient) in the imaging space (such as imaging space 18 of FIG. 1). Additionally, the MRI apparatus may automatically identify the RF coil array(s) to be used during scanning, for example, by identifying the connector (such as connectors 17a-17c of FIG. 1) of the coil array that has been plugged into the MRI system. Once the receive RF coil array(s) have been identified, the MRI system (e.g., the controller unit 25, RF driver unit 22, and/or the data acquisition unit 24) may obtain REGs information that dictate the grouping of the coil elements of the coil arrays that are connected to the MRI apparatus, which may be stored in memory of the MRI system or on a remote device in communication with the MRI system. The connected coil arrays may also be displayed to the operator via the display unit.

The scanning protocol and/or identification of the RF coil array(s) to be used during the scanning may include an identification of one or more rotatable RF coil arrays, as indicated at 303. For example, a head and neck RF coil array may not be rotatable given that the head and neck RF coil array has a defined shape to match the shape of the head and neck, and/or because the head and neck RF coil array is relatively rigid and fixed in place. A posterior RF coil array may be embedded in the table of the MRI system, and thus may not be rotatable. On the other hand, an anterior RF coil array may be a surface RF coil array that is placed by the operator on the imaging subject. As a result, the operator may be free to position the anterior RF coil array in one of multiple orientations, such as the first orientation illustrated in FIG. 2B or a second orientation where the anterior RF coil array is rotated 90° relative to the first orientation. While positioning the anterior RF coil array at the second orientation may enable better imaging of certain anatomy of certain imaging subjects (e.g., the torso of a large patient), if the MRI system is not aware of the orientation of the anterior RF coil array, the dynamic coil mode generation (described in more detail below) may be disrupted. Accordingly, the MRI system may automatically determine the RF coil array orientation if a rotatable coil array is to be used during the scan.

At 304, method 300 includes performing a localizer scan. The localizer scan may be a low resolution scan of the FOV. Herein, the low resolution scan is a scan with large voxel volume, which can be completed with reduced measurement time. In one example, the image data acquired during the localizer scan may be used to reconstruct an MR image of the FOV. The localizer scan may generate three 2D images of the subject, for example, in the sagittal, coronal, and the transverse planes.

At 306, method 300 performs a full mode low resolution calibration scan in a calibration FOV for generating calibration data to be used in determining the dynamic coil mode.

During the full mode calibration scan, each coil element of each RF coil array receives MR signals. One 3D dataset is generated for each channel from MR signals received from each respective channel, which may correspond to one coil element (or two or three coil elements, depending on the configuration of the MRI system and RF coil array). As such, each 3D dataset corresponds to one channel of the plurality of channels, and to one coil element to which the channel is electronically coupled. In some embodiments, MR signals from all channels of all coil arrays are collected. In other embodiments, MR signals from channels of selected coil arrays are collected. The coil arrays may be selected based on the relative position of the coil array from the imaging area. For example, coil arrays that are within a threshold distance from the FOV are set in the receiving mode during the calibration scan, while the non-selected coil arrays do not receive the MR signals. The threshold distance may be a distance within which the coil array is sensitive to the MR signals generated from the imaging area. In one embodiment, the localizer scan and the calibration scan may be combined, wherein a low resolution 3D scan of the FOV may generated both the localizer scan image and the calibration data.

At 308, method 300 includes determining whether to use a first set or a second set of REGs for selecting REGs of the dynamic coil mode. To determine if the first set or the second set of REGs is to be used for selecting REGs of the dynamic coil mode, an orientation of the rotatable RF coil array may be determined and then the first set or second set may be chosen based on the coil orientation. Additional details regarding the automatic determination of the rotatable RF coil array orientation are presented below with respect to FIGS. 4 and 9. Briefly, the data acquired during the lower resolution calibration scan may be used to determine a sensitivity extent for each REG of the first set of REGs and the second set of REGs. An average sensitivity value may be determined for the first set of REGs and the second set of REGs, and the set of REGs that has a higher sensitivity value (in one example) may be selected for determining the dynamic coil mode.

At 310, method 300 includes receiving a selection of a region of interest (ROI), which may be selected by the operator. For example, images generated by the localizer scan may be displayed on the display unit, and the operator may select the ROI for the main scan based on the images. The ROI may be smaller than the localizer FOV, at least in some examples. For example, the localizer FOV may be 50 cm along a scan direction, and the ROI may 20-30 cm along the scan direction. In some embodiments, the ROI may be defined by selection of the position of the corners of a 3D volume. In some embodiments, the ROI may be defined by the center position and ranges in each of the superior-inferior, medial-lateral, and posterior-anterior directions. In yet other embodiments, the ROI may be in the shape of a cube, which is defined by the center position, a range, and a rotational angle. For example, for cardiac scan, the ROI may be defined by the center position of the heart, a predetermined range, and a viewing angle.

At 312, method 300 determines if the ROI is beyond the calibration FOV (e.g., beyond the FOV imaged by the MRI system during the calibration scan). For example, when the operator indicates the ROI, the ROI may extend outside of the calibration FOV. If the ROI extends beyond the calibration FOV, method 300 proceeds to 313 to adjust the full mode calibration center and re-perform the full mode calibration scan. For example, the table may be moved or other action may be performed to adjust the center of the calibration FOV in order to maintain the ROI within the calibration FOV. Upon adjusting the calibration center and re-performing the calibration scan, method 300 proceeds to 316 described below.

If the ROI does not extend beyond the calibration FOV, method 300 proceeds to 316 to generate a dynamic coil mode based on the determined first set of REGs or second set of REGs. Once the rotatable RF coil array orientation has been determined and either the first set of REGs or the second set of REGs selected, the dynamic coil mode may be generated based on the datasets acquired during the calibration scan. The dynamic coil mode identifies the REGs that are to be used for imaging the ROI during the main scan. Generating the dynamic coil mode is described in more detail below with respect to FIG. 4. The dynamic coil mode may be generated for the rotatable RF coil array and may also be generated for other receive RF coil arrays that are to be used during the main scan.

In some examples, a visual representation of the dynamic coil mode may also be displayed together with images acquired via the localizer scan via a display unit (e.g., display unit 33). For example, an image of the imaging subject acquired during the localizer scan may be displayed along with an annotation illustrating the ROI. An extent of sensitivity of one or more REGs relative to the ROI may also be displayed. An extent of sensitivity of an REG may represent coverage of that REG along the coil selection direction, e.g., how much of the ROI that REG is sensitive to. In some examples, if a portion of the ROI is not covered by a REG, a mismatch notification may be output on the display to notify the operator that the ROI may not be sufficiently imaged with the current RF coil array placement.

At 318, method 300 includes performing the main scan using the determined dynamic coil mode. During the main scan, MR signals are received from the coil elements of the REGs selected based on the dynamic coil mode, but not from any coil elements not included in the selected REGs. In other words, the coil elements in the REGs other than the selected REGs are turned off during the main scan. The main scan is a high resolution 3D scan to generate high quality images of the ROI. The main scan has a lower voxel volume than the localizer scan and the calibration scan. Based on the MR signals obtained during the main scan, one or more images may be reconstructed, which may be displayed on the display unit and/or saved in memory (memory of the MRI system and/or a remote device, such as a hospital PACS).

Figure 4:
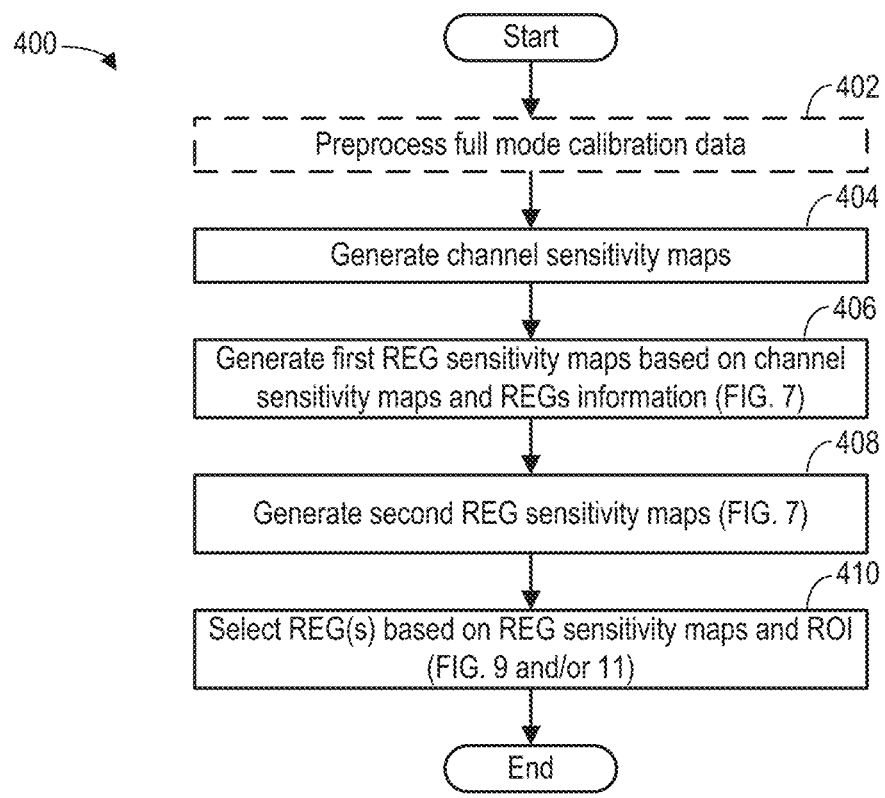
FIG. 4 is a flow chart illustrating an example subroutine for determining a dynamic coil mode based on data acquired from a calibration scan.

FIG. 4 shows an example subroutine 400 for generating the dynamic coil mode for a main scan based on the calibration data (e.g., the low resolution data acquired during the calibration scan) and ROI. The dynamic coil mode determines the REGs used for the main scan of the imaging subject in the ROI. The dynamic coil mode is determined based on REG sensitivity maps and the ROI, and also based on the RF coil array orientation (at least in examples where a rotatable RF coil array is present). Each REG sensitivity map may be generated by combining the channel sensitivity maps based on REGs information, as shown in FIG. 4. In the example presented herein, two sets of REG sensitivity maps are generated for each rotatable RF coil array. As described herein, one REG sensitivity map may be generated per REG, although other configurations are possible. The subroutine of FIG. 4 is explained with respect to a single RF coil array, and may be repeated for each RF coil array. FIG. 5 is a graphic illustration of the subroutine of FIG. 4.

After performing the full mode calibration scan (described above with respect to FIG. 3), subroutine 400 optionally includes processing the datasets acquired during the calibration scan at 402. In particular, error corrections may be performed on each 3D dataset of each channel. For example, one or more of the frequency map, the phase map, and slice gradwarp error map may be applied to the dataset to correct spatial distortions. Through the preprocessing, errors in 3D position of each data point of the digitized MR signals may be corrected.

At 404, a 1D channel sensitivity map is generated for each channel of the RF coil array. Specifically, the 3D dataset of each channel acquired during the calibration scan may be projected to the coil selection direction. In one example, the coil selection direction may be the S/I direction. FIG. 6 illustrates an example channel sensitivity map 610 that may be obtained by projecting a 3D dataset 605 onto the S/I direction. For example, the 3D dataset 605 may first be projected onto the sagittal plane 604 along the medial-lateral (R/L) direction 602. For example, to project the 3D dataset to a 2D plane, data points along the medial-lateral direction 602 are summed to obtain a data point in the sagittal plane 604. Then, the projected 2D data may be projected again onto the S/I direction.

At 406, a first set of REG sensitivity maps are generated based on the channel sensitivity maps and REGs information. The channel sensitivity maps may be combined according to the REGs information for the RF coil array (which defines the channels included in each REG). For example, the channel sensitivity maps of the channels associated with the coil elements within each of the predetermined REGs are summed for each data point in the coil selection direction. As such, the sensitivity of each REG is obtained. In examples where the REG sensitivity maps are used to determine coil orientation of a rotatable RF coil array, the channel sensitivity maps may be combined twice, once according to first REGs information and another time according to second REGs information. The first REGs information may indicate the coil elements are grouped into a first set of REGs according to rows, while the second REGs information may indicate the coil elements are grouped into a second set of REGs according to columns.

A first set of REG sensitivity maps is then generated based on the sensitivity of selected REGs according to the first REGs information. In particular, the sensitivity of each selected REG (e.g., the combined channel sensitivity maps for each channel of the selected REG) may first be arranged side by side along the projected direction, as shown in 510 of FIG. 5, to obtain raw REG sensitivity maps. The raw REG sensitivity maps are then processed based on the type and configuration of the coil array. Details for processing the raw REG sensitivity maps are presented in FIG. 7. The first set of REG sensitivity maps may represent the sensitivities of each REG of the first set of REGs.

At 408, subroutine 400 includes generating a second set of REG sensitivity maps. The second set of REG sensitivity maps may represent the sensitivities of each REG of the second set of REGs, and may be generated similarly to the first set of REG sensitivity maps.

At 410, subroutine 400 includes selecting one or more REGs based on the REG sensitivity maps and ROI. In this way, the dynamic coil mode for the main scan is determined based on the REG sensitivity maps and ROI. As an example, one or more REGs may be selected based on the extent of the REG sensitivity relative to the ROI. FIG. 11 shows examples for determining the dynamic coil mode. For a rotatable coil, the orientation of the RF coil array may be determined based on an average sensitivity value of the first set of REG sensitivity maps relative to an average sensitivity value of the second set of REG sensitivity maps, as explained in more detail below with respect to FIG. 9. The set of REG sensitivity maps that corresponds to the determined coil orientation is then selected for the determination of the dynamic coil mode. Likewise, the first set or second set of REGs are indicated as being selectable based on the orientation, and during the generation of the dynamic coil mode, only the REGs indicated as being selectable may be selected for inclusion in the dynamic coil mode.

FIG. 5 is a graphical representation of subroutine 400 of FIG. 4. The low resolution data acquired during the calibration scan includes preprocessed volumetric (e.g., 3D) data for each channel, shown herein as 3D dataset 502. Each 3D channel set of 3D dataset 502 corresponds to one channel of an RF coil array. A total of n channels are shown here. Each channel set of the 3D dataset 502 is projected to the coil selection direction (e.g., the S/I direction) to obtain a respective 1D channel sensitivity map, thus generating a plurality of channel sensitivity maps 504. Thus, n channel sensitivity maps are generated for n channels. Details regarding the projection procedure are presented in FIG. 7.

In one example, the coil selection direction may be a direction along which coil elements have different coverages. In other words, the extent of one or more coil elements covers different regions along the coil selection direction. For example, the RF coil array 210 may be arranged into six REGs, each REG comprising a row of coil elements extending along a first direction (e.g., horizontally). The coil selection direction may be along a second direction perpendicular to the first direction (e.g., vertical), as the coil elements of each REG has different coverage along the second direction. As explained above, if the RF coil array is rotated so that the rows are actually columns, the rows now extend along the second (coil selection) direction, which may disrupt the REG selection process for the dynamic coil mode if the rotation of the RF coil array is not detected. In one example, the RF coil array may include REGs that have different coverages in more than one direction. The coil selection direction may be one of the multiple directions, determined based on the imaging protocol. In another example, the coil selection direction may be the same as the slice selection direction during the MRI scan. In other words, the coil selection direction is perpendicular to the plane containing the imaging slice. The coil selection direction may also be the same as the scan direction.

As shown in subroutine 400, the channels are first combined based on the predetermined REGs information. As explained earlier, the REGs information is predetermined rules for grouping coil elements of the coil array for transmitting and/or receiving MR signals. The channel sensitivity maps are grouped and combined for each REG. As explained earlier, each REG may correspond to a set of one or more RF coil elements, and thus grouping the channel sensitivity maps may include, for a given REG, combining the channel sensitivity maps for each channel that is coupled to a coil element belonging to the given REG. Herein, t REGs are shown at 506. For example, REGs information defines REG 1 as including channel 1 and channel 2. The channel sensitivity maps of channels 1 and 2 are summed along the S/I direction. Similarly, channel sensitivity maps of channels 3 and 4 are combined for REG 2. REG t includes channel n, and so on.

Raw REG sensitivity maps are obtained based on the combined sensitivity maps 506 of the t selected REGs. An example raw set of REG sensitivity maps representing the sensitivities of four REGs is shown in 510. The x-axis is the pixel number in S/I direction. Alternatively, the x-axis may be distance (such as centimeter) along the coil selection direction. Each row corresponds to the sensitivity of one REG along the S/I direction. The values of the sensitivity are displayed along the S/I direction in grayscale. The brighter the grayscale value, the higher the value of the sensitivity.

The channel grouping based on the REGs information and ultimate generation of the REG sensitivity maps shown in FIG. 5 may be performed twice for a rotatable RF coil array, once according to first REGs information that specifies a first set of REGs (e.g., rows) and again according to second REGs information that specifies a second set of REGs (e.g., columns). The resulting first set of REG sensitivity maps and second set of REGs sensitivity maps may be generated from the same low resolution calibration data but may represent different combinations of the projections of that low resolution calibration data.

Figure 7:
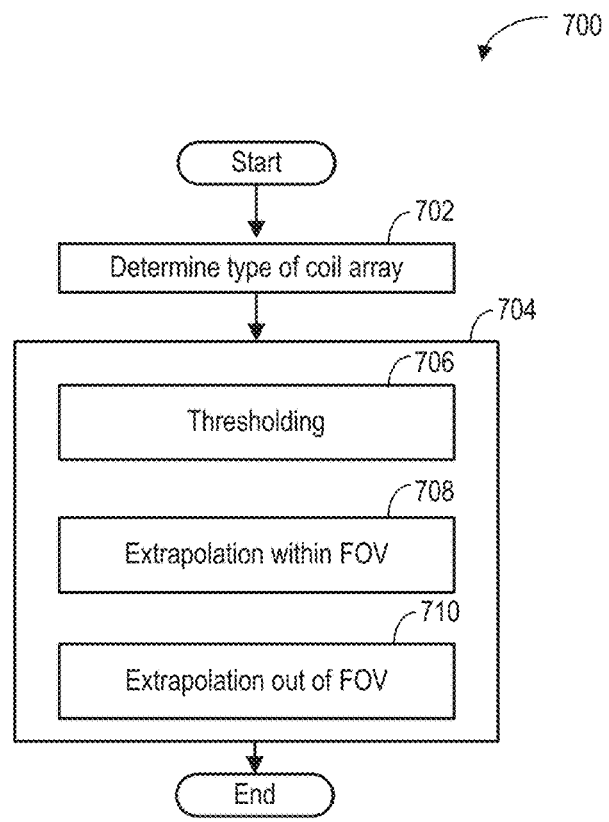
FIG. 7 is a flow chart illustrating an example subroutine for processing a raw REG sensitivity map.

Turning to FIG. 7, subroutine 700 for processing raw REG sensitivity maps (such as REG sensitivity maps generated at 406 of FIG. 4) is shown. The raw REG sensitivity maps may be processed based on the type of the coil array. FIGS. 8A-8C show examples of REG sensitivity maps generated based on the raw REG sensitivity maps via subroutine 700.

At 702, the type of the coil array represented in the raw REG sensitivity maps is determined. For example, the subroutine may determine if the RF coil array is a fixed-to-table coil (e.g., posterior coil), floating coil (e.g., anterior coil), rigid coil (e.g., head and neck coil), flexible coil (e.g., air coil), or other type of RF coil array. In other examples, the subroutine may determine the length of the RF coil array (e.g., relative to the FOV) and/or number of REGs in the RF coil array.

At 704, the sensitivity of each REG in the raw REG sensitivity maps may be processed based on the type of coil array. In one example, at 706, the raw REG sensitivity maps are thresholded with a threshold sensitivity level. The threshold sensitivity level may be determined based on the noise level of the MR signals. Any data point of the REG sensitivity map having a valve lower than the threshold sensitivity level is set to a fixed low level (such as zero). An example set of raw REG sensitivity maps 801 is shown in FIG. 8A for an RF coil array having four REGs, such as the head-neck coil array. Similar to the raw REG sensitivity maps 510 of FIG. 5, each row of the set of raw REG sensitivity maps 801 represents the combined sensitivities of each channel corresponding to one REG along the coil selection direction. After thresholding, low level data points are discarded by setting those data points (e.g., pixels) to a zero value. The sensitivity extent for each REG may be determined as the extent of non-zero sensitivity of the REG. For example, the sensitivity extent 810 of the first REG 811 is shown in FIG. 8A.

In another example, additionally or alternatively, the processing may include replacing the thresholded sensitivity of each REG with a Gaussian fitting of the same extent. The Gaussian fitting replacement may be applied to REGs of an anterior coil array or a posterior coil array, for example. In one example, as shown in FIG. 8B, the thresholded sensitivity of the first REG of the set of raw REGs sensitivity maps 803 is replaced with a Gaussian fitting 822. The Gaussian fitting 822 is shown in grayscale of the set of REG sensitivity maps 804. For each row of the set of raw REG sensitivity maps, the thresholded sensitivity values are replaced with a Gaussian curve of the same extent along the coil selection direction (such as the S/I direction). In one example, the Gaussian curve is determined by fitting the thresholded sensitivity of the REG. In another embodiment, the Gaussian curve has a predetermined maximum value and variance determined by the original signal (e.g., the maximum value is the same as or similar to the maximum value of the original signal).

In an example, at 708, the REG sensitivity maps may be extrapolated within the FOV. In one example, the REG sensitivity maps may be extrapolated to the REGs not receiving MR signals during the calibration scan. In another example, the REG sensitivity maps may be extrapolated to the REGs that receive low amplitude MR signals during the calibration scan. The REG sensitivity maps may be extrapolated based on the information of the REGs of the coil array. For example, the sensitivity of a first REG included in the REG sensitivity maps may be extrapolated to a second REG if the second REG has the same configuration as the first REG. The configuration may include the number and type of coil elements, relative position of the coil elements, and the rigidity of the coil array.

FIG. 8B shows an example of extrapolated set of REG sensitivity maps 804 of an anterior coil array based on the set of raw REG sensitivity maps 803. In the set of raw REG sensitivity maps 803, the sixth REG has low values. As such, all values of the sixth REG in the set raw of REG sensitivity maps 803 are set to zero during the thresholding process. As the sixth REG is of the same type of the fifth REG, and the relative position of the sixth REG and the fifth REG is assumed to be the same as the relative position of the fifth REG and the fourth REG, the sensitivity of the sixth REG may be determined based on the sensitivity of the fifth REG. In one example, sensitivity of the sixth REG 805 is added to the set of REG sensitivity maps 804 by shifting the sensitivity of the fifth REG based on the relative position between the fifth and sixth REGs. In another example, sensitivity for the sixth REG may be a Gaussian curve with an extent the same as the extent of the fifth REG. As such, without an additional calibration scan, the extrapolated set of REG sensitivity maps 804 may be generated to cover the full FOV 820 along the S/I direction.

In yet another example, at 710, the REG sensitivity maps may be extrapolated outside of the FOV. The extrapolation may be based on similarity of the REGs, the coil array rigidity, and type and position of the coil elements. Extrapolation outside of the FOV may be applied to posterior coil arrays or other arrays with coil elements that lie outside the FOV and/or that are not prone to movement or positioning variability. As the calibration scan may not be able to cover the full extent of the coil array along the coil selection direction, by extrapolating the REG sensitivity maps outside of the FOV, a set of REG sensitivity maps for the entire coil array may be obtained based on one calibration scan of the imaging area.

FIG. 8C shows an example of an extrapolated set of REG sensitivity maps 807 of a posterior coil array based on the set of raw REG sensitivity maps 806. The set of raw REG sensitivity maps 806 may be generated by executing a calibration scan within FOV 830 and projecting the data onto the S/I direction. As the REGs outside of the FOV 830 are similar to the REGs within the FOV (similar in that the REGs may have the same number of coil elements, be spaced apart by an equal manner, etc.), the set of REG sensitivity maps after thresholding and Gaussian fitting replacement may be extrapolated to cover the entire extent 831 of the coil array. In one example, as the relative positions among the coil elements of the posterior array are fixed, the set of REG sensitivity maps may be extrapolated outside of the FOV 830 by shifting the REG sensitivity maps within FOV 830 based on prior knowledge of relative positions between the REGs in the posterior coil array.

FIG. 9 is a flow chart illustrating a method 900 for automatically determining an orientation of a rotatable RF coil array, such as RF coil array 210 of FIG. 2B. Method 900 may be performed by a processor that executes instructions stored in non-transitory memory of a computing device, such as controller unit 25 of MRI apparatus 10 of FIG. 1. Method 900 may be performed as part of method 300, for example in order to determine if the first set of REGs or the second set of REGs is selectable, based the coil orientation, as specified at 308 of FIG. 3.

At 902, method 1000 includes determining a first sensitivity value of a first set of REG sensitivity maps. The first set of REG sensitivity maps may be generated according to the subroutine 400 described above with respect to FIG. 4. The first set of REG sensitivity maps may represent sensitivities of each REG of a first set of REGs. The first set of REGs may correspond to the rows of the RF coil array 210, assuming the RF coil array is in the first orientation illustrated in FIG. 2B.

The first average sensitivity value may be a suitable value that represents an extent of the sensitivity of each REG of the first set of REG sensitivity maps. In one example, the first average sensitivity value may include an average peak sensitivity value, as indicated at 904. For example, referring to the set of REG sensitivity maps 804 of FIG. 8B, each REG has a plurality of sensitivity values that extend along the S/I direction. The sensitivity values may be replaced by a Gaussian fitting that includes a peak sensitivity value. For example, the sensitivity values may be represented in pixel brightness values (e.g., from 0 to 255 with 0 being black/no brightness and 255 being white/full brightness), and a peak sensitivity value may represent the brightest sensitivity value of that REG (e.g., a sensitivity value of 200). The peak sensitivity value may be determined for each REG and then the peak sensitivity values may be averaged to determine an average peak sensitivity value.

In another example, the first average sensitivity value may include an average sensitivity range, as indicated at 906. Again referring to the set of REG sensitivity maps 804 of FIG. 8B, the Gaussian fitting for each REG includes a plurality of different sensitivity values, from relatively low sensitivity values (e.g., a sensitivity value of 10) to relatively high sensitivity values (e.g., a sensitivity value of 200). The range of sensitivity values for each REG may be determined. The range may include the lowest sensitivity value and the highest sensitivity value. In another example, the range may include a histogram of sensitivity values that represents each different sensitivity value and that value's relative representation. In still further examples, the range may include the standard deviation of the Gaussian fitting. The ranges of sensitivity values may be averaged to obtain the average range of sensitivity values.

In another example, the first average sensitivity value may include an average peak-to-peak distance, as indicated at 908. As appreciated by the set of REG sensitivity maps 804 of FIG. 8B, when each set of sensitivity values is replaced with a Gaussian fitting, each REG is represented by a Gaussian fitting along the x axis (which is the S/I direction in the presented example). The distance between the first peak and second peak (along the x axis) may be determined, the distance between the second peak and third peak may be determined, etc. The peak-to-peak distances may be averaged to determine the average peak-to-peak distance. In a still further example, the first average sensitivity value may include a REG sensitivity extent, as indicated at 910. The REG sensitivity extent may include a distance (along the x axis) where that REG has a sensitivity value (e.g., that has not been thresholded out). The sensitivity extents of each REG may be determined and then averaged to obtain the average REG sensitivity extent.

The average sensitivity value selected as the first sensitivity value may depend on the configuration of the RF coil array. For example, some RF coil arrays may include coil elements of different sizes and thus different REGs may include different sensitivity extents and/or different peak-to-peak values. In some examples, more than one first sensitivity value may be selected.

At 912, method 900 includes determining a second average sensitivity value of a second set of REG sensitivity maps. The second set of REG sensitivity maps may be generated according to the subroutine 400 described above with respect to FIG. 4. The second set of REG sensitivity maps may represent the sensitivities of each REG of a second set of REGs. The second set of REGs may correspond to the columns of the RF coil array 210, assuming the RF coil array is in the first orientation illustrated in FIG. 2B.

The second average sensitivity value may be determined similarly to the first sensitivity value. For example, the second sensitivity value may include an average peak value, as indicated at 914, an average sensitivity range, as indicated at 916, an average peak-to-peak distance, as indicated at 918, and/or an average REG extent, as indicated at 920. The average sensitivity value selected to be the second average sensitivity value may be the same as the value selected to be the first sensitivity value. In other words, if the first sensitivity value is an average peak value, the second average sensitivity value will also be an average peak value.

At 922, method 900 includes determining if the first and second sensitivity values indicate that the RF coil array is in a rotated configuration. As explained above, the RF coil array 210 may be rotatable between a first orientation and a second orientation. The first orientation may be the default orientation of the RF coil array, such that the assumed rows are actual rows and the assumed columns are actual columns. The second orientation may be the rotated configuration. To determine if the RF coil array is in the non-rotated or rotated configuration (e.g., in the first orientation or the second orientation), method 900 may compare the first sensitivity value to the second sensitivity value, and/or may compare each sensitivity value to a threshold. When the sensitivity values are peak sensitivities, the RF coil array may be determined to be in the non-rotated position (first orientation) when the first average peak sensitivity is higher than the second peak sensitivity value, or when the first average peak sensitivity value is higher than a threshold and the second average peak sensitivity value is lower than the threshold. The RF coil array may be determined to be in the rotated position (second orientation) when the first average peak sensitivity is lower than the second peak sensitivity value, or when the first average peak sensitivity value is lower than a threshold and the second average peak sensitivity value is higher than the threshold.

In another example, when the sensitivity values are average sensitivity ranges, the RF coil array may be determined to be in the non-rotated position (first orientation) when the first average sensitivity range is higher (e.g., has a larger range of values) than the second sensitivity range, or when the first average sensitivity range is higher than a threshold and the second average sensitivity range is lower than the threshold. The RF coil array may be determined to be in the rotated position (second orientation) when the first average sensitivity range is lower (e.g., has a smaller range of values)

than the second sensitivity range, or when the first average sensitivity range is lower than a threshold and the second average sensitivity range is higher than the threshold.

In another example, when the sensitivity values are average peak-to-peak distances, the RF coil array may be determined to be in the non-rotated position (first orientation) when the first average peak-to-peak distance is measurable (e.g., more than one peak is detected) and the second average peak-to-peak distance is not measurable (e.g., discrete peaks are not detected). The RF coil array may be determined to be in the rotated position (second orientation) when the first average peak-to-peak distance is not measurable and the second average peak-to-peak distance is measurable. In another example, the RF coil array may be determined to be in the non-rotated position (first orientation) when the first average peak-to-peak distance is larger than the second average peak-to-peak distance and the RF coil array may be determined to be in the rotated position (second orientation) when the first average peak-to-peak distance is smaller than the second average peak-to-peak distance.

In a still further example, when the sensitivity values are average REG sensitivity extents, the RF coil array may be determined to be in the non-rotated position (first orientation) when the first average REG sensitivity extent is smaller than the second average REG sensitivity extent, or when the first average REG sensitivity extent is smaller than a threshold and the second average REG sensitivity extent is larger than the threshold. The RF coil array may be determined to be in the rotated position (second orientation) when the first average REG sensitivity extent is larger than the second average REG sensitivity extent, or when the first average REG sensitivity extent is larger than a threshold and the second average REG sensitivity extent is smaller than the threshold.

If the first and second sensitivity values do not indicate the RF coil array is rotated, method 900 proceeds to 924 to determine the dynamic coil mode based on the first set of sensitivity maps and the ROI, which will be explained in more detail below with respect to FIG. 11. When the RF coil array is not rotated (e.g., the RF coil array is in the first orientation shown in FIG. 2B), the REGs may be grouped as rows, resulting in measurable sensitivity values for each row REG (represented in the first set of REG sensitivity maps) but not measurable sensitivity values for each column REG (represented in the second set of REG sensitivity maps). Thus, the first set of REG sensitivity maps may be used to select the REGs for the dynamic coil mode, and only the first set of REGs may be selected from for determining the dynamic coil mode. Method 900 then ends.

If the first and second sensitivity values do indicate the RF coil array is rotated, method 900 proceeds to 926 to determine the dynamic coil mode based on the second set of REG sensitivity maps and the ROI, which will be explained in more detail below with respect to FIG. 11. When the RF coil array is rotated (e.g., the RF coil array is in the second orientation which is rotated 90° relative to the first orientation shown in FIG. 2B), the REGs may be grouped as columns, but because the RF coil array is rotated, the columns are actually rows in the rotated position, resulting in measurable sensitivity values for each column REG (represented in the second set of REG sensitivity maps) but not measurable sensitivity values for each row REG (represented in the first set of REG sensitivity maps). Thus, the second set of REG sensitivity maps may be used to select the REGs for the dynamic coil mode, and only the second set of REGs may be selected from for determining the dynamic coil mode. Method 900 then ends.

FIG. 10 illustrates example REG sensitivity maps representing the REG sensitivities for a first set of REGs and a second set of REGs of a first rotatable RF coil array, such as an anterior RF coil array, and REG sensitivity maps representing the REG sensitivities for a third set of REGs and a fourth set of REGs of a second rotatable RF coil array. For example, RF coil array 210 of FIG. 2B may be grouped into a first set of REGs that correspond to the rows of the RF coil array and a second set of REGs that correspond to the columns of the RF coil array.

REG sensitivity maps 1000 includes a first set of REG sensitivity maps representing REG sensitivities for a first set of REGs (the row REGs), which are represented along the y axis as HDAAR1 (high density anterior array row 1) through HDAAR6, and a second set of REG sensitivity maps representing REG sensitivities for a second set of REGs (the column REGs) represented along the y axis as HDAAC1 (high density anterior array column 1) through HDAAC5. A third set of REG sensitivity maps are also shown for a non-rotatable coil (e.g., the posterior RF coil array), labeled as HDPA1 through HDPA12.

A first REG sensitivity 1010 is highlighted (e.g., by the white box) that represents the calculated sensitivity for one REG of the first set of REGs (the fifth row REG of the anterior RF coil array). The first REG sensitivity 1010 may include a sensitivity curve 1012 that represents the sensitivity values for the first REG sensitivity 1010 on the first set of REG sensitivity maps. The curve 1012 may have a peak value 1014 and an extent 1016. An average peak value for the first set of REG sensitivity maps may be determined by averaging peak value 1014 with the other peak values for the REGs of the first set of REG sensitivity maps (e.g., the row REGs). Likewise, an average REG extent for the first set of REG sensitivity maps may be determined by averaging extent 1016 with the other REG extents determined for the other REG extents for the REGs of the first set of REG sensitivity maps (e.g., the row REGs).

A second REG sensitivity 1002 is highlighted (e.g., by the black box) that represents the calculated sensitivity for one REG of the second set of REGs (the first column REG of the anterior RF coil array). The second REG sensitivity 1002 may include a sensitivity curve 1004 that represents the sensitivity values for the second REG sensitivity 1002 on the second set of REG sensitivity maps. The curve 1004 may have a peak value 1006 and an extent 1008. An average peak value for the second set of REG sensitivity maps may be determined by averaging peak value 1006 with the other peak values for the REGs of the second set of REG sensitivity maps (e.g., the column REGs). Likewise, an average REG extent for the second set of REG sensitivity maps may be determined by averaging extent 1008 with the other REG extents determined for the other REG extents for the REGs of the second set of REG sensitivity maps (e.g., the column REGs).

As appreciated by comparing the first REG sensitivity 1010 to the second REG sensitivity 1002, the RF coil array is in the non-rotated, first orientation. The second REG sensitivity 1002 has a large extent, low sensitivity values, and a small range of sensitivity values. In contrast, the first REG sensitivity 1010 has a small extent, high sensitivity values, and a large range of sensitivity values. For example, the peak value 1014 is higher than the peak value 1006, indicating the REGs of the first set of sensitivity maps have a higher sensitivity than the REGs of the second set of sensitivity maps. Further, the extent 1008 is longer than the extent 1016, indicating that discrete sensitivities relating to the location of each REG along the S/I direction are present for the REGs of the first set of REG sensitivity maps but not the second set of REG sensitivity maps. Accordingly, the discrete location of each REG (along the S/I direction) can be determined from the first set of REG sensitivity maps but not the second set of REG sensitivity maps. Thus, the RF coil array is determined to be in the first orientation, and the first set of REG sensitivity maps are selected for the selection of the dynamic coil mode.

FIG. 10 also includes REG sensitivity maps 1020 for another RF coil array, including a third set of REG sensitivity maps representing REG sensitivities for a third set of REGs (the row REGs) represented along the y axis as R1-R6, and a fourth set of REG sensitivity maps representing REG sensitivities for a second set of REGs (the column REGs) represented along the y axis as C1-C5.

A third REG sensitivity 1030 is highlighted (e.g., by a white box) that represents the sensitivity for one REG of the third set of REGs (the first row REG of the RF coil array). The third REG sensitivity may include a sensitivity curve 1032 that represents the sensitivity values for the third REG sensitivity 1030 on the third set of REG sensitivity maps. The curve 1032 may have a peak value 1034 and an extent 1036. An average peak value for the third set of REG sensitivity maps may be determined by averaging peak value 1034 with the other peak values for the REGs of the third set of REG sensitivity maps (e.g., the row REGs). Likewise, an average REG extent for the third set of REG sensitivity maps may be determined by averaging extent 1036 with the other REG extents determined for the other REG extents for the REGs of the third set of REG sensitivity maps (e.g., the row REGs).

A fourth REG sensitivity 1022 is highlighted (e.g., by a white box) that represents the sensitivity for one REG of the fourth set of REGs (the fourth column REG of the anterior RF coil array). The fourth REG sensitivity 1022 may include a sensitivity curve 1024 that represents the sensitivity values for the fourth REG sensitivity 1022 on the fourth set of REG sensitivity maps. The curve 1024 may have a peak value 1026 and an extent 1028. An average peak value for the fourth set of REG sensitivity maps may be determined by averaging peak value 1016 with the other peak values for the REGs of the fourth set of REG sensitivity maps (e.g., the column REGs). Likewise, an average REG extent for the fourth set of REG sensitivity maps may be determined by averaging extent 1028 with the other REG extents determined for the other REG extents for the REGs of the fourth set of REG sensitivity maps (e.g., the column REGs).

As appreciated by comparing the fourth REG sensitivity 1022 to the third REG sensitivity 1030, the RF coil array represented by the REG sensitivity maps 1020 is in the rotated, second orientation. The fourth REG sensitivity 1022 has a small extent, high sensitivity values, and a large range of sensitivity values. In contrast, the third REG sensitivity 1030 has a large extent, low sensitivity values, and a small range of sensitivity values. For example, the peak value 1024 is higher than the peak value 1034, indicating the REGs of the fourth set of REG sensitivity maps have a higher sensitivity than the REGs of the third set of REG sensitivity maps. Further, the extent 1028 is shorter than the extent 1036, indicating that discrete sensitivities of each REG along the S/I direction are present for the REGs of the fourth set of REG sensitivity maps but not the third set of REG sensitivity maps. Accordingly, the discrete sensitivity of each REG (along the S/I direction) can be determined from the fourth set of REG sensitivity maps but not the third set of REG sensitivity maps. Thus, the RF coil array is determined to be in the second orientation, and the fourth set of REG sensitivity maps may be selected for the selection of the dynamic coil mode.

FIG. 11 shows examples of REG(s) identified for various dynamic coil modes for a main scan based on a selected set of REG sensitivity maps 1101 and the ROI. The selected set of REG sensitivity maps may be selected based on the determine coil orientation described above and may only represent REGs that are selectable for the dynamic coil mode. In some embodiments, REG(s) with an extent of sensitivity overlapping with the ROI are first identified. For example, ROI 1 ranges from P1 to P2 along the S/I direction, and the first REG and second REG are identified for ROI 1 because the extents of sensitivity of both REGs overlap ROI 1. As another example, ROI 2 ranges from P2 to P3 along the S/I direction, and overlaps the extents of sensitivity of the first, second, and third REGs. As such, the first, second, and third REGs are identified for ROI 2. In an example, the REGs may be identified further based on the sensitivity values of the REGs in the set of the REG sensitivity maps. For example, REGs with high accumulative sensitivity within the ROI may be identified.

In further embodiments, it is determined whether the identified REGs are compatible with each other. The identified REGs might be exclusive of each other. For example, if the first REG consists of all coil elements in the anterior coil array 210 and the second REG consists of coil elements in row 211, the first and second REGs are exclusive of each other because they both include coil elements in row 211. Therefore, in some embodiments, tiebreaker rules may be applied to select one REG from exclusive REGs. For example, if parallel imaging is used, bigger REG (i.e., first REG) is preferred; while if reduction of phase wrap artifact is preferred, smaller REG (i.e., second REG) is preferred. In some embodiments, multiple factors are considered in totality and the REG that strikes the best balance is selected from exclusive REGs.

In this way, the sensitivity of each coil element of an RF coil array comprising a plurality of coil elements may be determined from low resolution scan data acquired during a pre-scan (e.g., a calibration scan performed prior to a main imaging scan). The low resolution scan data may be volumetric data that is acquired for each channel of the RF coil array (the channels may be defined by the receive circuitry that transfers MR signals obtained by the coil elements to a control unit for processing; in some embodiments, each coil element may be individually coupled to a respective channel). The low resolution scan data may be projected to one dimension along the coil selection direction. For example, the 3D data for each channel may be projected to one dimension along the superior-inferior direction, thereby generating a plurality of channel sensitivity maps. The channel sensitivity maps may be grouped according to REGs information. For example, a coil array may include six rows of coil elements with five coil elements per row, and each row may be constrained such that all coil elements in a row are activated/tuned together. Such a grouping would result in six REGs, each REG having five coil elements. For a given REG, the channel sensitivity maps corresponding to the five coil elements that make up that REG are combined. The resulting REG sensitivity map then conveys the coverage, along the coil selection direction, of each REG.

As explained above, the REG sensitivity maps convey the sensitivity along the coil direction of each REG. For example, referring to FIG. 2B, REG row 3 (highlighted in FIG. 2B) includes five coil elements aligned along the x axis.

When the calibration data for the coil elements of REG R3 is projected onto the S/I direction (along the y axis) and combined (e.g., summed), a discrete extent of sensitivity along the S/I direction results that roughly corresponds to the average diameter of the coil elements comprising REG R3. In contrast, REG column 2 (highlighted in FIG. 2B) includes six coil elements aligned along the y axis. When the calibration data for the coil elements of REG C3 are projected onto the S/I direction (along the y axis) and combined (e.g., summed), a large extent of sensitivity along the S/I direction results that roughly corresponds to the combined coil diameters of all six coil elements of REG C3.

Thus, when an RF coil array is rotatable, the REGs that are assumed to extend perpendicular to the coil selection direction (the row REGs) may instead extend along the coil selection direction (e.g., along the y axis in FIG. 2B). If the channel sensitivity maps for the channels are combined according to only the row REG grouping, the REG sensitivity extents may be determined only when the RF coil array is in the first orientation; when the RF coil array is in the second orientation, the discrete sensitivity of each REG cannot be determined. Thus, as described with respect to the embodiments above, the sensitivities of the two different REGs, rows versus columns, may be determined and the RF coil array orientation may be determined based on the sensitivities (e.g., are the rows actually rows, or are they columns). The REG sensitivity maps that correspond to the orientation of the RF coil array may then be used for subsequent dynamic coil mode determination.

The selected REG sensitivity maps may then be compared to a user-selected imaging ROI. For example, the user-set ROI may have an extent along the coil selection direction. Any REG with an extent of sensitivity that overlaps the ROI may be identified, in some embodiments. Any REG that does not overlap the ROI may be excluded. If the identified REGs include exclusive REGs, one REG is selected from the exclusive REGs according to tiebreaker rules. The selected REGs may then be used for imaging during the main scan and the non-selected, excluded REGs may not be used for imaging during the main scan. In this way, an RF coil array that includes a plurality of coil elements may be used to receive MR signals during a main imaging MR scan, with only a subset (e.g., some but not all) of the coil elements being activated to receive MR signals. One or more images may then be reconstructed from the received MR signals. By receiving MR signals with only a subset of the coil elements, and deactivating the remaining coil elements of the RF coil array, noise that may otherwise be contributed to the image from the coil elements located outside the ROI may be reduced, thus improving image quality.

The embodiments described above relate to projecting the calibration data onto the S/I direction and then comparing the REG sensitivity extents relative to a ROI along the S/I direction. However, other configurations are possible. For example, if the imaging protocol selected by the operator of the MRI system indicates that the coil selection direction is along the medial-lateral axis (R/L) or along a different direction (e.g., anterior to posterior), the calibration data may be projected along that direction (e.g., R/L), and REGs may be identified by comparing the REGs sensitivity extents relative to a ROI along the R/L direction. Such an example assumes that the REGs may be selectable along that coil direction, such as being arranged into columns in addition or alternative to rows.

The dynamic coil mode determination described above was generally described with respect to one ROI, or multiple ROIs within a same calibration FOV of the imaging subject as defined by the MRI system (e.g., MRI bore length, gradient extent, transmit RF coil coverage, etc.). However, some imaging protocols, such as full body imaging protocols, may dictate that the imaging subject be moved through multiple stations (e.g., table positions) and a main scan be performed at each station in order to generate images of the entire body, or at least large regions of the body (e.g., the legs). To maintain dynamic coil generation at each station, a new calibration scan may be performed for each station. In one example, shown in FIGS. 12 and 13 and described below, a series of calibrations scans may be performed (e.g., one for each station) before any of the main scans occur, and the calibration scan data may be stored in memory and retrieved each time a new dynamic coil mode determined. In another example, shown in FIGS. 14 and 15 and described below, a calibration scan may be performed each time the table is moved to a new station, and the dynamic coil mode determined from data acquired during that calibration scan.

Figure 12:
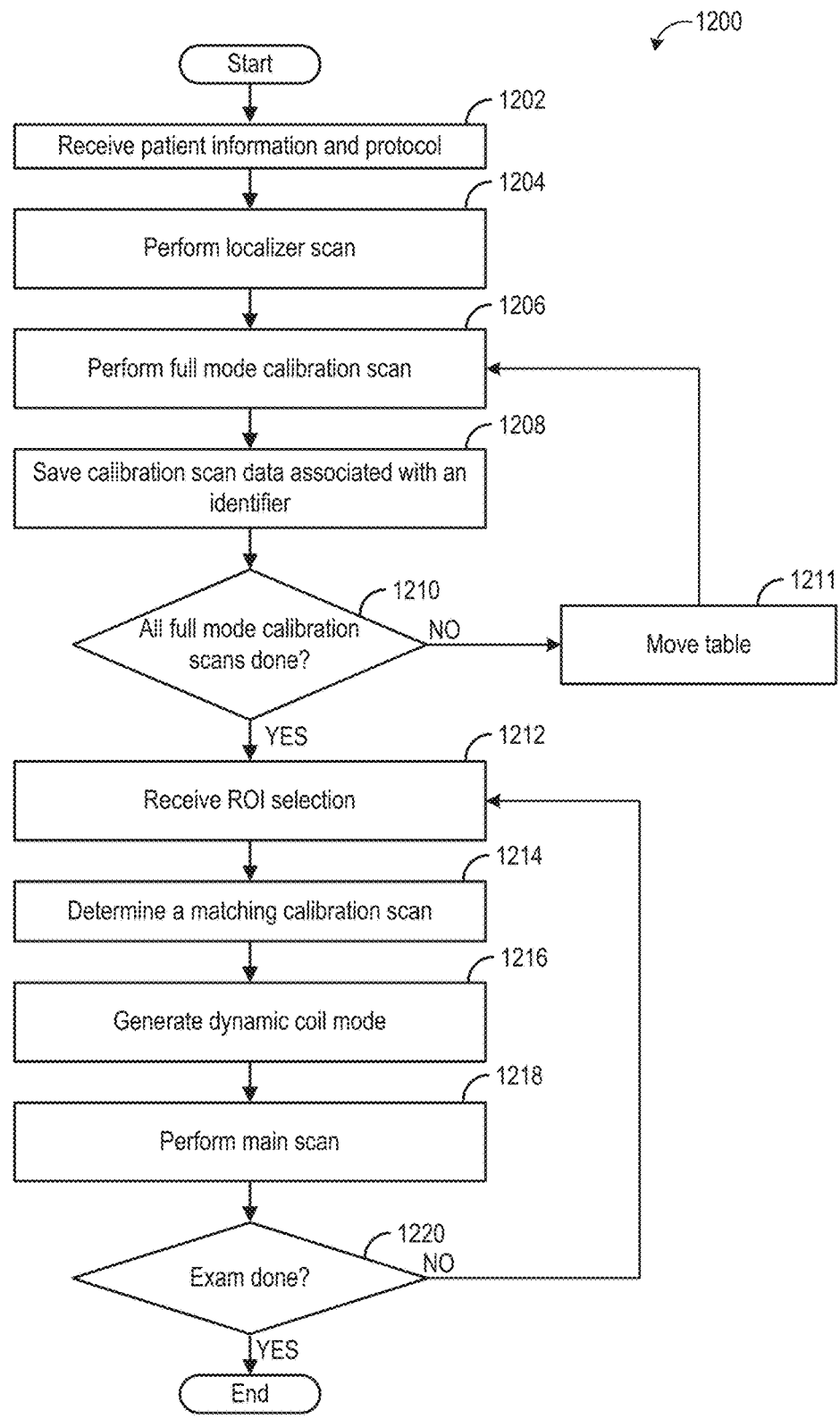
FIG. 12 is a flow chart illustrating a first example method for performing a full body scan.

Referring now to FIG. 12, a method 1200 for performing a full body scan according to a first embodiment is shown. Method 1200 may be performed by a processor that executes instructions stored in non-transitory memory of a computing device, such as controller unit 25 of MRI apparatus 10 of FIG. 1. Method 1200 may be performed in response to the indication that a full body scan is to be performed as specified from a scanning protocol, for example. While the term full body scan is used herein, it is to be understood that the following method is not restricted to a full body scan and may be applied for scans that include less than a full body, or scans that include a non-human imaging subject. For example, method 1200 may be performed in response to an indication to perform a scan through at least two stations of a table of an MRI system.

At 1202, method 1200 includes receiving patient information and a scanning protocol. The patient information and scanning protocol may be similar to the patient information and scanning protocol described above with respect to FIG. 3, and hence description of the patient information and protocol described above likewise applies to the patient information and scanning protocol received at 1202. As explained above, the scanning protocol may indicate that a full body scan (or a scan of least two stations of a table are to be performed). At 1204, method 1200 includes performing a localizer scan. The localizer scan performed at 1204 may be similar to the localizer scan of FIG. 3, and thus the description of the localizer scan performed at 304 of FIG. 3 likewise applies to the localizer scan of method 1200, and thus further description is description is dispensed with.

At 1206, method 1200 includes performing a full mode calibration scan. The full mode calibration scan may be similar to the full mode calibration scan of method 300 of FIG. 3, and thus description of the full mode calibration scan performed at 306 of FIG. 3 likewise applies to the full mode calibration scan of method 1200. At 1208, method 1200 includes saving the calibration scan data with an identifier. For example, the low resolution data acquired during the calibration scan may be saved in memory of the MRI system along with information that may be used to associate that calibration data with the current table position.

At 1210, method 1200 includes determining if all full mode calibration scans have been completed. In one example, a calibration scan may be performed for each calibration FOV of the prescribed imaging target (e.g., the full body) which may be specified by the scanning protocol. If all the prescribed full mode calibration scans have not been completed, method 1200 proceeds to 1211 to move the table to the next position. The next position of the table may move the current region of the imaging subject out of the center of the bore of the MRI system and move the next region to be imaged into the center of the bore of the MRI system. The MRI system may automatically move the table once the first main scan is complete, or the MRI may prompt the operator to move the table. After moving the table, method 1200 loops back to 1206 to perform a new calibration scan and save the new calibration scan data in memory.

If all the full mode calibration scans have been completed, method 1200 proceeds to 1212 to receive a selection of a region of interest (ROI). The receiving of the ROI may be similar to the receiving of the ROI of FIG. 3, and thus the description of the receiving of the ROI performed at 310 of FIG. 3 likewise applies to the receiving of the ROI performed at 1212, and thus further description is description is dispensed with.

At 1214, method 1200 determines a matching calibration scan. For example, the ROI may be compared to one or more calibration scans (performed previously, with the calibration data obtained from the scans stored in memory) to determine which calibration scan(s) acquired data that overlaps and/or matches the current ROI. The data from the matching calibration scan is then used to generate the REG sensitivity maps as described above with respect to FIG. 4.

At 1216, method 1200 includes determining first dynamic coil mode based on the REG sensitivity maps and the current ROI. The dynamic coil mode determination may be performed according to subroutine 400 described above with respect to FIG. 4 (whereby the REG sensitivity maps are generated) and the process illustrated in FIG. 11 (whereby REGs are identified for inclusion in the dynamic coil mode based on the REG sensitivity maps and ROI).

At 1218, method 1200 includes performing the main scan of the current ROI with the determined coil mode. The main scan performed at 1210 may be similar to the main scan performed at 318 of FIG. 3, and thus description of the main scan provided above with respect to FIG. 3 likewise applies to the main scan performed at 1218. From the MR signals obtained during the main scan, one or more images of the imaging subject may be reconstructed. However, in some examples, the reconstruction may be performed once each station has been imaged.

At 1220, method 1200 determines if the exam is complete. The exam may be complete once all regions of the imaging subject have been imaged, which may be determined according to operator input, the scanning protocol, and/or other mechanism. If the exam is not complete, method 1200 loops back to 1212 to receive a new ROI selection. The new ROI may be out of the current FOV and thus method 1200 may also include moving the table to a next position. Once a new ROI is received and the table moved (if indicated), a new matching calibration scan may be identified and retrieved, a new dynamic coil mode may be determined, and new main scan performed. If the exam is complete, method 1200 ends.

Thus, method 1200 described above includes a full body scan that is performed using two head to toe (or toe to head) sweeps of table positions. Accordingly, all the calibration scans are performed before any of the main scans are performed. By doing so, the time it takes to perform the main scans may be decreased, which may be advantageous in time-sensitive imaging protocols such as when a contrast agent is injected (e.g., the calibration scans may be acquired before injection of the contrast agent). While method 1200 was described above as including one localizer scan being performed before the calibration scans are performed, other configurations are possible. For example, only the calibration scans may be performed during the first sweep of table positions, and one or more localizer scans may be performed during the second sweep of table positions, for example a localizer scan may be performed and a ROI obtained before each main scan.

Figure 13:
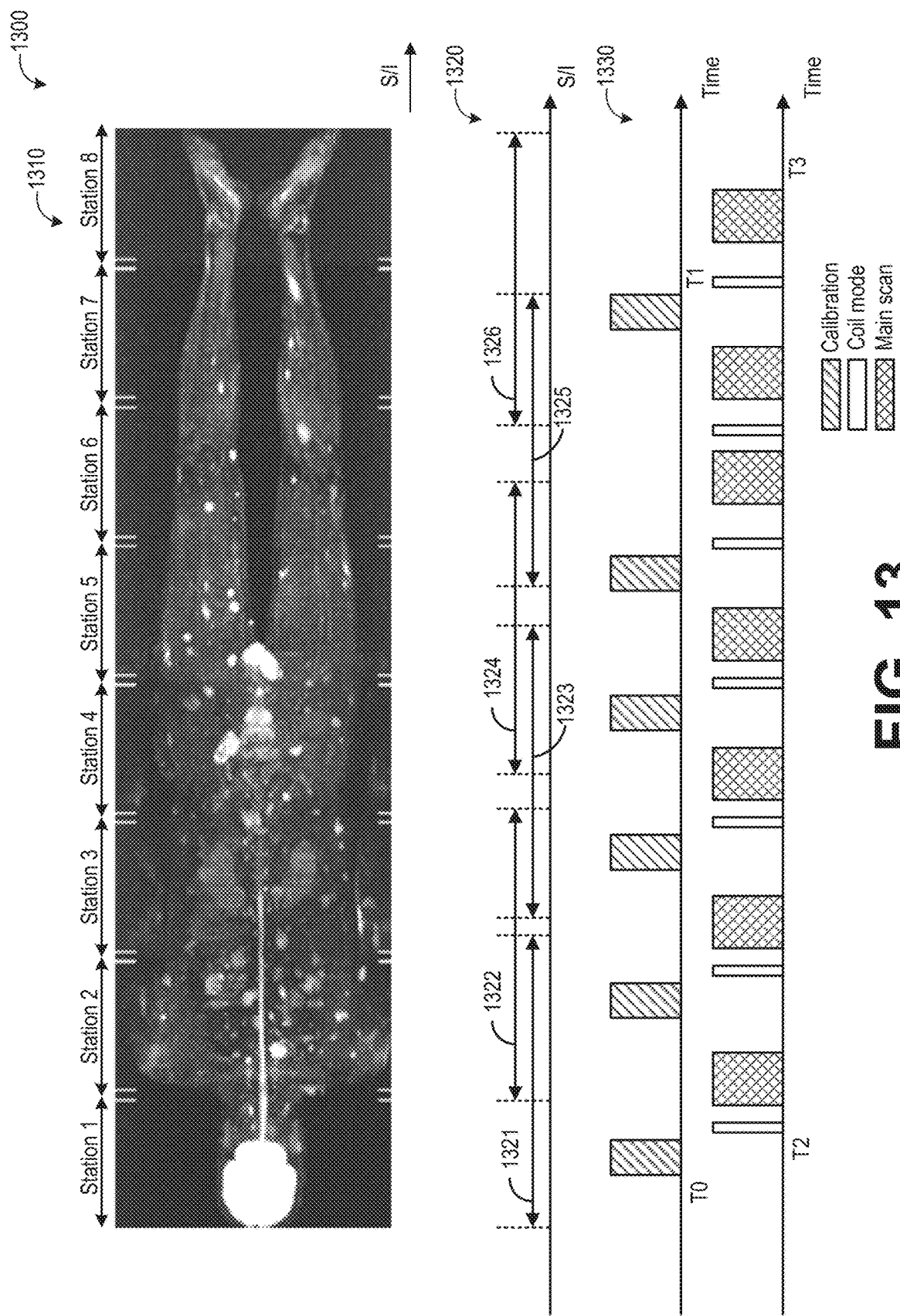
FIG. 13 schematically shows a process for performing the full body scan according to the method of FIG. 12.

FIG. 13 illustrates the timeline 1300 for a full body scan executed according to the method 1200 of FIG. 12. Timeline 1300 includes a 2D image 1310 of an imaging subject. Because the imaging subject is longer (along the S/I direction) than the FOV/bore of the MRI system, the imaging subject is imaged in stages. Accordingly, the table on which the imaging subject is positioned may be moved into the MRI bore in different stations (or table positions). As shown in FIG. 13, a first station corresponds to the imaging subject's head, a second station corresponds to the imaging subject's shoulders and chest, a third station corresponds to the imaging subject's upper torso, and so forth, ending with an eighth station that corresponds with the imaging subject's feet. In the example of FIG. 13, a first table position may be a position that places station 1 and station 2 into the bore of the MRI system. However, other positions are possible, such as commencing with the feet rather than the head.

In addition to the representation 1310 of the imaging subject, FIG. 13 includes a coverage 1320 of each calibration scan along the S/I direction. As shown, a first calibration scan 1321 scans station 1 and station 2, a second calibration scan 1322 scans station 2 and station 3, a third calibration scan 1323 scans station 3, station 4, and a portion of station 5, a fourth calibration scan 1324 scans a portion of station 4, station 5, and a portion of station 6, a fifth calibration scan 1325 scans a portion of station 5, station 6, and portion of station 7, and a sixth calibration scan 1326 scans station 7 and station 8.

FIG. 13 includes an event timeline 1330 illustrating each calibration scan, dynamic coil mode determination, and main scan performed in the full body scan as a function of time. Event timeline 1330 includes a first sweep of table positions commencing at time T0 and ending at time T1 and a second sweep of table positions commencing at time T2 and ending at time T3. Each calibration scan is depicted by a striped bar, each coil mode determination is depicted by a white bar, and each main scan is depicted by a cross-hatched bar. As shown, six calibration scans are performed between T0 and T1. Seven main scans are performed between T2 and T3. Prior to each main scan, a new dynamic coil mode is determined based on the low resolution data acquired from a corresponding calibration scan. Except for the fifth calibration scan, the data from each calibration scan is used to determine a dynamic coil mode for one main scan. However, the data from the fifth calibration scan is used for two main scans, the fifth and sixth main scans.

Figure 14:
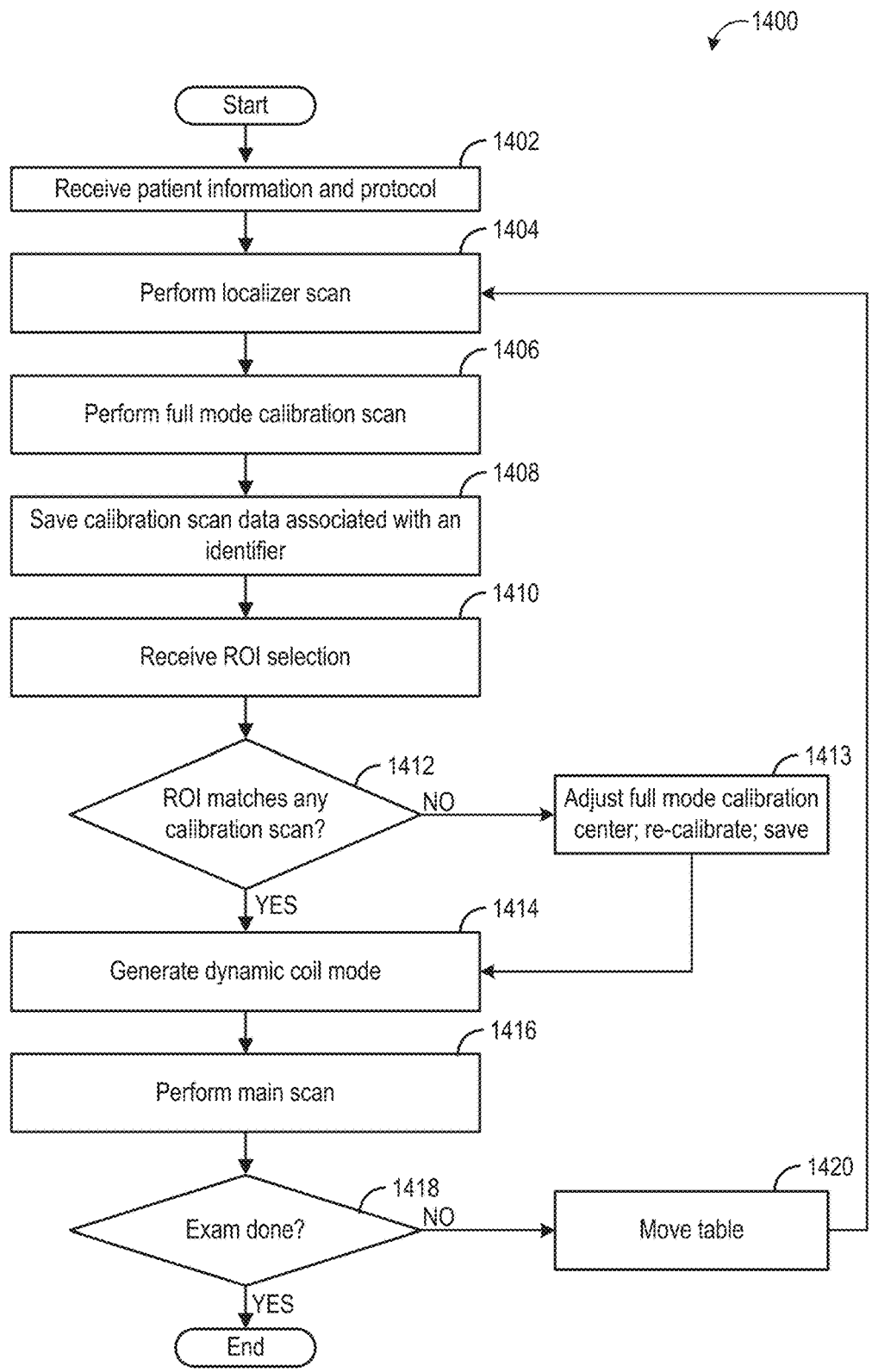
FIG. 14 is a flow chart illustrating a second example method for performing a full body scan.

Referring now to FIG. 14, a method 1400 for performing a full body scan according to a second embodiment is shown. Method 1400 may be performed by a processor that executes instructions stored in non-transitory memory of a computing device, such as controller unit 25 of MRI apparatus 10 of FIG. 1. Method 1400 may be performed in response to an indication that a full body scan is to be performed. While the term full body scan is used herein, it is to be understood that the following method is not restricted to a full body scan and may be applied for scans that include less than a full body, or scans that include a non-human imaging subject. For example, method 1400 may be performed in response to an indication to perform a scan through at least two stations of a table of an MRI system.

At 1402, method 1400 includes receiving patient information and a scanning protocol. The patient information and scanning protocol may be similar to the patient information and scanning protocol described above with respect to FIG. 3, and hence description of the patient information and protocol described above likewise applies to the patient information and scanning protocol received at 1402. As explained above, the scanning protocol may indicate that a full body scan (or a scan of least two stations of a table are to be performed). At 1404, method 1400 includes performing a localizer scan. The localizer scan performed at 1404 may be similar to the localizer scan of FIG. 3, and thus the description of the localizer scan performed at 304 of FIG. 3 likewise applies to the localizer scan of method 1400, and thus further description is description is dispensed with.

At 1406, method 1400 includes performing a full mode calibration scan. The full mode calibration scan may be similar to the full mode calibration scan of method 300 of FIG. 3, and thus description of the full mode calibration scan performed at 306 of FIG. 3 likewise applies to the full mode calibration scan of method 1400. At 1408, method 1400 includes saving the calibration scan data with an identifier. For example, the low resolution data acquired during the calibration scan may be saved in memory of the MRI system along with information that may be used to associate that calibration data with the current table position.

At 1410, method 1400 includes receiving a selection of a region of interest (ROI). The receiving of the ROI may be similar to the receiving of the ROI of FIG. 3, and thus the description of the receiving of the ROI performed at 310 of FIG. 3 likewise applies to the receiving of the ROI performed at 1410, and thus further description is description is dispensed with.

At 1412, method 1400 determines if the current ROI matches any calibration scans. For example, the ROI may be compared to one or more calibration scans saved in memory to determine which calibration scan(s) acquired data that overlaps and/or matches the current ROI. The data from the matching calibration scan is then used to generate the REG sensitivity maps as described above with respect to FIG. 4. If the ROI does not match any calibration scans, method 1400 proceeds to 1413 to adjust the full mode calibration center, re-perform the calibration scan, and save the calibration data. Method 1400 then proceeds to 1414, described below.

If a matching calibration scan is determined, method 1400 proceeds to 1414 to generate a dynamic coil mode based on the REG sensitivity maps and the current ROI. The dynamic coil mode determination may be performed according to subroutine 400 described above with respect to FIG. 4 (whereby the REG sensitivity maps are generated) and the process illustrated in FIG. 11 (whereby REGs are identified for inclusion in the dynamic coil mode based on the REG sensitivity maps and ROI).

At 1416, method 1400 includes performing the main scan of the current ROI with the determined coil mode. The main scan performed at 1416 may be similar to the main scan performed at 318 of FIG. 3, and thus description of the main scan provided above with respect to FIG. 3 likewise applies to the main scan performed at 1416. From the MR signals obtained during the main scan, one or more images of the imaging subject may be reconstructed. However, in some examples, the reconstruction may be performed once each station has been imaged.

At 1418, method 1400 determines if the exam is complete. The exam may be complete once all regions of the imaging subject have been imaged, which may be determined according to operator input, the scanning protocol, and/or other mechanism. If the exam is not complete, method 1400 moves the table of the MRI system at 1420 and then loops back to 1404 to perform a new localizer scan, calibration scan, and receive a new ROI. Once a new ROI is received, a new dynamic coil mode may be determined, and new main scan performed. If the exam is complete, method 1400 ends.

Thus, method 1400 described above includes a full body scan that is performed using only one head to toe (or toe to head) sweep of table positions. Accordingly, a new calibration scan is performed each time (or nearly each time) the table is moved. By doing so, patient comfort may be increased by requiring only sweep of the table positions. Further, depending on the movement of the table, a new calibration scan may not have to be performed each time the table is moved. Rather, upon moving the table, if a calibration scan has been performed at an earlier table position, the MRI system may obtain that calibration scan data and determine if a new dynamic coil mode for the new ROI is needed. If the previous calibration scan includes sufficient data to determine the dynamic coil mode for the new ROI, an additional calibration scan may be dispensed with, improving the efficiency of the full body scan.

Figure 15:
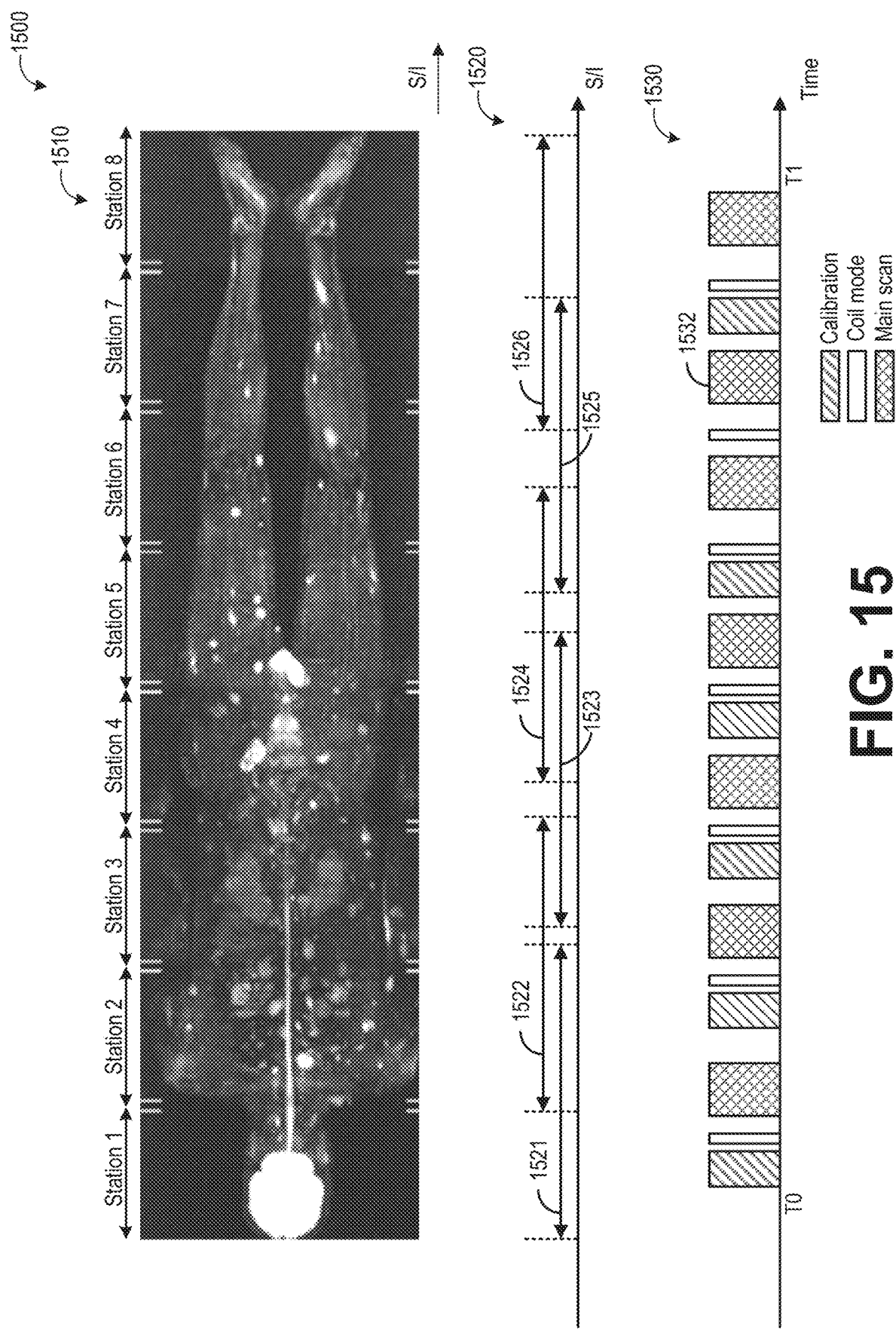
FIG. 15 schematically shows a process for performing the full body scan according to the method of FIG. 14.

FIG. 15 illustrates a timeline 1500 of events during for a full body scan executed according to the method 1400 of FIG. 14. Timeline 1500 includes a 2D image 1510 of an imaging subject. Because the imaging subject is longer (along the S/I direction) than the FOV/bore of the MRI system, the imaging subject is imaged in stages. Accordingly, the table on which the imaging subject is positioned may be moved into the MRI bore in different stations (or table positions). As shown in FIG. 15, a first station corresponds to the imaging subject's head, a second station corresponds to the imaging subject's shoulders and chest, a third station corresponds to the imaging subject's upper torso, and so forth, ending with an eighth station that corresponds with the imaging subject's feet. In the example of FIG. 15, a first table position may be a position that places station 1 and station 2 into the bore of the MRI system. However, other positions are possible, such as commencing with the feet rather than the head.

In addition to a representation 1510 of an imaging subject, FIG. 15 includes a coverage 1520 of each calibration scan along the S/I direction. As shown, a first calibration scan 1521 scans station 1 and station 2, a second calibration scan 1522 scans station 2 and station 3, a third calibration scan 1523 scans station 3, station 4, and a portion of station 5, a fourth calibration scan 1524 scans a portion of station 4, station 5, and a portion of station 6, a fifth calibration scan 1525 scans a portion of station 5, station 6, and portion of station 7, and a sixth calibration scan 1526 scans station 7 and station 8.

FIG. 15 includes an event timeline 1530 illustrating each calibration scan, dynamic coil mode determination, and main scan performed in the full body scan as a function of time, commencing at time T0 and ending at time T1. Each calibration scan is depicted by a striped bar, each coil mode determination is depicted by a white bar, and each main scan is depicted by a cross-hatched bar. For the first main scan, the second main scan, the third main scan, the fourth main scan, and the fifth main scan, a calibration scan is performed prior to each respective main scan. However, for the sixth main scan 1532, the dynamic coil mode is determined without performing a new calibrations scan. For example, the fifth calibration scan 1525 may acquire sufficient low resolution data to determine the dynamic coil modes for both the fifth main scan and the sixth main scan.

The technical effect of automatically determining RF coil array orientation is that the predetermined receive element group (REG) information may be correctly applied in order to select one or more REGs to be included in a dynamic coil mode, thereby allowing non-selected REGs to be turned off and not used during a main scan, increasing signal to noise ratio of the resulting images.

An example provides for a method for magnetic resonance imaging (MRI) with a rotatable receive radio frequency (RF) coil array comprising a plurality of coil elements. The method includes grouping the plurality of coil elements into receive elements groups (REGs) according to REGs information; generating channel sensitivity maps for the plurality of coil elements; generating REG sensitivity maps based on the REGs information and the channel sensitivity maps; labeling each REG as either selectable or not selectable based on the REG sensitivity maps; selecting one or more REGs from the selectable REGs based on the REG sensitivity maps and a region of interest (ROI); and scanning the ROI with the coil elements in the one or more selected REGs being activated and the coil elements not in any selected the other REGs being deactivated. In a first example of the method, when the RF coil array is in a first orientation, the plurality of coil elements are arranged in an array of a first number of rows and a second number of columns, wherein each coil element of the RF coil array is coupled to a control unit via a channel of a plurality of channels, wherein each channel sensitivity map corresponds to a respective channel, and wherein, for a given channel, the corresponding sensitivity map represents a sensitivity of one or more coil elements that are coupled to the given channel. In a second example of the method, which optionally includes the first example, generating the channel sensitivity maps comprises generating the channel sensitivity maps by projecting 3D scan data acquired over a corresponding channel onto a single dimension along a coil selection direction, the 3D scan data acquired during a lower resolution calibration performed before the scanning of the ROI. In a third example of the method, which optionally includes one or both of the first and second examples, generating the REG sensitivity maps based on the REGs information and the channel sensitivity maps comprises generating a first set of REG sensitivity maps from the plurality of sensitivity maps, the first set of REG sensitivity maps representing respective sensitivities of a first plurality of REGs, and wherein each REG of the first plurality of REGs comprises a respective row of coil elements of the plurality of coil elements. In a fourth example of the method, which optionally includes one or more or each of the first through third examples, generating the first set of REG sensitivity maps includes, for a first REG comprising a first row of coil elements, combining channel sensitivity maps of each channel associated with each coil element in the first row, and for each additional REG comprising a respective additional row of coil elements, combining channel sensitivity maps of each channel associated with each coil element in that respective additional row. In a fifth example of the method, which optionally includes one or more or each of the first through fourth examples, generating the REG sensitivity maps based on the REGs information and the channel sensitivity maps further comprises generating a second set of REG sensitivity maps from the channel sensitivity maps, the second set of REG sensitivity maps representing respective sensitivities of a second plurality of REGs, and wherein each REG of the second plurality of REGs comprises a respective column of coil elements of the plurality of coil elements. In a sixth example of the method, which optionally includes one or more or each of the first through fifth examples, generating the second set of REG sensitivity maps includes, for a first REG comprising a first column of coil elements, combining sensitivity maps of each channel associated with each coil element in the first column, and for each additional REG comprising a respective additional column of coil elements, combining sensitivity maps of each channel associated with each coil element in that additional column. In a seventh example of the method, which optionally includes one or more or each of the first through sixth examples, labeling each REG as either selectable or not selectable based on the REG sensitivity maps comprises labeling each REG as either selectable or not selectable based on the first set of REG sensitivity maps and the second set of REG sensitivity maps. In an eighth example of the method, which optionally includes one or more or each of the first through seventh examples, labeling each REG as either selectable or not selectable based on the first set of REG sensitivity maps and the second set of REG sensitivity maps comprises: obtaining an average row sensitivity value for the first set of REG sensitivity maps; obtaining an average column sensitivity value for the second set of REG sensitivity maps; if the average row sensitivity value meets a predetermined condition relative to the average column sensitivity value, indicating that each REG of the first plurality of REGs is selectable and each REG of the second plurality of REGs is not selectable; and if the average column sensitivity value meets a predetermined condition relative to the average row sensitivity value, indicating that each REG of the second plurality of REGs is selectable and each REG of the first plurality of REGs is not selectable. In a ninth example of the method, which optionally includes one or more or each of the first through eighth examples, the average row sensitivity value comprises an average peak sensitivity for the first set of REG sensitivity maps, wherein the average column sensitivity value comprises an average peak sensitivity for the second set of REG sensitivity maps, and wherein the average row sensitivity value meeting the predetermined condition relative to the average column sensitivity value comprises the average peak sensitivity for the first set of REG sensitivity maps being greater than the average peak sensitivity for the second set of REG sensitivity maps. In a tenth example of the method, which optionally includes one or more or each of the first through ninth examples, the average row sensitivity value comprises an average range of sensitivity values for the first set of REG sensitivity maps, wherein the average column sensitivity value comprises an average range of sensitivity values for the second set of REG sensitivity maps, and wherein the average row sensitivity value meeting the predetermined condition relative to the average column sensitivity value comprises the average range of sensitivity values for the first set of REG sensitivity maps being greater than the average range of sensitivity values for the second set of REG sensitivity maps. In an eleventh example of the method, which optionally includes one or more or each of the first through tenth examples, selecting one or more REGs from the selectable REGs based on the REG sensitivity maps and ROI comprises: when the first plurality of REGs are labeled as selectable, selecting one or more REGs from the first plurality of REGs that have a sensitivity extent that overlaps the ROI as determined by the first set of REG sensitivity maps, and when the second plurality of REGs are labeled as selectable, selecting one or more REGs from the second plurality of REGs that have a sensitivity extent that overlaps the ROI as determined by the second set of REG sensitivity maps. In a twelfth example of the method, which optionally includes one or more or each of the first through eleventh examples, the method further includes reconstructing an image from MR signals obtained by the coil elements in the one or more selected REGs.

An example provides a magnetic resonance imaging (MRI) system, including: a radio frequency (RF) coil array comprising a plurality of RF coil elements; a controller unit coupled to the RF coil array, the controller unit including a processor and a memory storing instructions executable by the processor to: select one or more coil elements of the plurality of RF coil elements based on an automatically determined orientation of the RF coil array; obtain MR signals from the one or more selected coil elements; and reconstruct an image from the obtained MR signals. In a first example of the system, the plurality of RF coil receive elements are groupable into a first set of receive element groups (REGs) and a second set of REGs, and wherein the instructions are executable to generate a first set of REG sensitivity maps for the first set of REGs and second set of REG sensitivity maps for the second set of REGs based on low resolution calibration data obtained during a previous scan. In a second example of the system, which optionally includes the first example, the instructions are executable to automatically determine the orientation of the RF coil array based on sensitivity values of the first set of REG sensitivity maps relative to sensitivity values of the second set of REG sensitivity maps. In a third example of the system, which optionally includes one or both of the first and second examples, the instructions are executable to: when the RF coil array is determined to be in a first orientation, select one or more REGs that have a sensitivity extent that overlaps a region of interest (ROI) as determined by the first set of REG sensitivity maps, and when the RF coil array is determined to be in a second orientation, select one or more REGs that have a sensitivity extent that overlaps the ROI as determined by the second set of REG sensitivity maps. In a fourth example of the system, which optionally includes one or more or each of the first through third examples, the instructions that are executable to obtain MR signals from the one or more selected coil elements include instructions that are executable to activate each coil element of the selected one or more REGs to obtain the MR signals and maintain any remaining coil elements in a deactivated state.

An example provides for a method for magnetic resonance imaging (MRI) with a receive radio frequency (RF) coil array comprising a plurality of coil elements. The method includes automatically determining whether the RF coil array is in a first orientation or a second orientation based on first sensitivity maps relative to second sensitivity maps, the first sensitivity maps representing a sensitivity of each coil element of the plurality of coil elements to MR signals when the plurality of coil elements are grouped into a first set of receive element groups (REGs), the second sensitivity maps representing a sensitivity of each coil element of the plurality of coil elements to MR signals when the plurality of coil elements are grouped into a second set of REGs; when the RF coil array is in the first orientation, selecting one or more REGs of the first set of REGs based on the first sensitivity maps and a region of interest (ROI); when the RF coil array is in the second orientation, selecting one or more REGs of the second set of REGs based on the second sensitivity maps and the ROI; obtaining MR signals from only the selected one or more REGs and not from any non-selected REGs during a main scan; and reconstructing an image from the obtained MR signals. In a first example of the method, the main scan is a first main scan of a first region of an imaging subject, wherein the first sensitivity maps and second sensitivity maps are generated from low resolution data acquired during a first calibration scan of the first region performed before the first main scan, and the method further includes: responsive to a command to perform a second main scan of a second region of the imaging subject, performing a second calibration scan of the second region of the imaging subject; generating third sensitivity maps from low resolution calibration data acquired during the second calibration scan; selecting one or more REGs based on the third sensitivity maps and a new ROI; and obtaining MR signals from only the one or more REGs selected based on the third sensitivity maps and new ROI and not from any non-selected REGs during the second main scan.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for magnetic resonance imaging (MRI) with a rotatable receive radio frequency (RF) coil array comprising a plurality of coil elements, the method comprising:
grouping the plurality of coil elements into receive elements groups (REGs) according to REGs information;
generating channel sensitivity maps for the plurality of coil elements based on scan data acquired with the plurality of coil elements during a lower resolution calibration scan;
generating REG sensitivity maps based on the REGs information and the channel sensitivity maps;
labeling each REG as either selectable or not selectable based on the REG sensitivity maps;
selecting one or more REGs from the selectable REGs based on the REG sensitivity maps and a region of interest (ROI);
performing a higher resolution main scan of the ROI with the coil elements in the one or more selected REGs being activated and the coil elements not in any selected REG being deactivated; and
reconstructing an image from MR signals obtained by the coil elements in the one or more selected REGs.

2. The method of claim 1, wherein when the RF coil array is in a first orientation, the plurality of coil elements are arranged in an array of a first number of rows and a second number of columns, wherein each coil element of the RF coil array is coupled to a control unit via a channel of a plurality of channels, wherein each channel sensitivity map corresponds to a respective channel, and wherein, for a given channel, the corresponding sensitivity map represents a sensitivity of one or more coil elements that are coupled to the given channel.

3. The method of claim 2, wherein generating the channel sensitivity maps comprises generating the channel sensitivity maps by projecting 3D scan data acquired over a corresponding channel onto a single dimension along a coil selection direction, the 3D scan data acquired during a lower resolution calibration performed before the scanning of the ROI.

4. The method of claim 3, wherein generating the REG sensitivity maps based on the REGs information and the channel sensitivity maps comprises generating a first set of REG sensitivity maps from the plurality of sensitivity maps, the first set of REG sensitivity maps representing respective sensitivities of a first plurality of REGs, and wherein each REG of the first plurality of REGs comprises a respective row of coil elements of the plurality of coil elements.

5. The method of claim 4, wherein generating the first set of REG sensitivity maps includes, for a first REG comprising a first row of coil elements, combining channel sensitivity maps of each channel associated with each coil element in the first row, and for each additional REG comprising a respective additional row of coil elements, combining channel sensitivity maps of each channel associated with each coil element in that respective additional row.

6. The method of claim 4, wherein generating the REG sensitivity maps based on the REGs information and the channel sensitivity maps further comprises generating a second set of REG sensitivity maps from the channel sensitivity maps, the second set of REG sensitivity maps representing respective sensitivities of a second plurality of REGs, and wherein each REG of the second plurality of REGs comprises a respective column of coil elements of the plurality of coil elements.

7. The method of claim 6, wherein generating the second set of REG sensitivity maps includes, for a first REG comprising a first column of coil elements, combining sensitivity maps of each channel associated with each coil element in the first column, and for each additional REG comprising a respective additional column of coil elements, combining sensitivity maps of each channel associated with each coil element in that additional column.

8. The method of claim 6, wherein labeling each REG as either selectable or not selectable based on the REG sensitivity maps comprises labeling each REG as either selectable or not selectable based on the first set of REG sensitivity maps and the second set of REG sensitivity maps.

9. The method of claim 8, wherein labeling each REG as either selectable or not selectable based on the first set of REG sensitivity maps and the second set of REG sensitivity maps comprises:
obtaining an average row sensitivity value for the first set of REG sensitivity maps;
obtaining an average column sensitivity value for the second set of REG sensitivity maps;
if the average row sensitivity value meets a predetermined condition relative to the average column sensitivity value, indicating that each REG of the first plurality of REGs is selectable and each REG of the second plurality of REGs is not selectable; and
if the average column sensitivity value meets a predetermined condition relative to the average row sensitivity value, indicating that each REG of the second plurality of REGs is selectable and each REG of the first plurality of REGs is not selectable.

10. The method of claim 9, wherein the average row sensitivity value comprises an average peak sensitivity for the first set of REG sensitivity maps, wherein the average column sensitivity value comprises an average peak sensitivity for the second set of REG sensitivity maps, and wherein the average row sensitivity value meeting the predetermined condition relative to the average column sensitivity value comprises the average peak sensitivity for the first set of REG sensitivity maps being greater than the average peak sensitivity for the second set of REG sensitivity maps.

11. The method of claim 9, wherein the average row sensitivity value comprises an average range of sensitivity values for the first set of REG sensitivity maps, wherein the average column sensitivity value comprises an average range of sensitivity values for the second set of REG sensitivity maps, and wherein the average row sensitivity value meeting the predetermined condition relative to the average column sensitivity value comprises the average range of sensitivity values for the first set of REG sensitivity maps being greater than the average range of sensitivity values for the second set of REG sensitivity maps.

12. The method of claim 9, wherein selecting one or more REGs from the selectable REGs based on the REG sensitivity maps and ROI comprises:
when the first plurality of REGs are labeled as selectable, selecting one or more REGs from the first plurality of REGs that have a sensitivity extent that overlaps the ROI as determined by the first set of REG sensitivity maps, and
when the second plurality of REGs are labeled as selectable, selecting one or more REGs from the second plurality of REGs that have a sensitivity extent that overlaps the ROI as determined by the second set of REG sensitivity maps.

13. A magnetic resonance imaging (MRI) system, comprising:
a radio frequency (RF) coil array comprising a plurality of RF coil elements arranged into one or more rows and one or more columns;
a controller unit coupled to the RF coil array, the controller unit including a processor and a memory storing instructions executable by the processor to:
automatically determine an orientation of the RF coil array, including determining if the RF coil array is in a first orientation where the one or more columns are parallel to a superior-inferior (SI) axis of a patient or a second orientation where the one or more columns are perpendicular to the SI axis of the patient;
select one or more coil elements of the plurality of RF coil elements based on the automatically determined orientation of the RF coil array;
obtain magnetic resonance (MR) signals from the one or more selected coil elements; and
reconstruct an image from the obtained MR signals.

14. The system of claim 13, wherein the plurality of RF coil receive elements are groupable into a first set of receive element groups (REGs) and a second set of REGs, and wherein the instructions are executable to generate a first set of REG sensitivity maps for the first set of REGs and second set of REG sensitivity maps for the second set of REGs based on low resolution calibration data obtained during a previous scan.

15. The system of claim 14, wherein the instructions are executable to automatically determine the orientation of the RF coil array based on sensitivity values of the first set of REG sensitivity maps relative to sensitivity values of the second set of REG sensitivity maps.

16. The system of claim 15, wherein the instructions are executable to:
when the RF coil array is determined to be in a first orientation, select one or more REGs that have a sensitivity extent that overlaps a region of interest (ROI) as determined by the first set of REG sensitivity maps, and
when the RF coil array is determined to be in a second orientation, select one or more REGs that have a sensitivity extent that overlaps the ROI as determined by the second set of REG sensitivity maps.

17. The system of claim 16, wherein the instructions that are executable to obtain MR signals from the one or more selected coil elements include instructions that are executable to activate each coil element of the selected one or more REGs to obtain the MR signals and maintain any remaining coil elements in a deactivated state.

18. A method for magnetic resonance imaging (MRI) with a receive radio frequency (RF) coil array comprising a plurality of coil elements, the method comprising:
automatically determining whether the RF coil array is in a first orientation or a second orientation based on first sensitivity maps relative to second sensitivity maps, the first sensitivity maps representing a sensitivity of each coil element of the plurality of coil elements to magnetic resonance (MR) signals when the plurality of coil elements are grouped into a first set of receive element groups (REGs), the second sensitivity maps representing a sensitivity of each coil element of the plurality of coil elements to MR signals when the plurality of coil elements are grouped into a second set of REGs;
when the RF coil array is in the first orientation, selecting one or more REGs of the first set of REGs based on the first sensitivity maps and a region of interest (ROI);
when the RF coil array is in the second orientation, selecting one or more REGs of the second set of REGs based on the second sensitivity maps and the ROI;
obtaining MR signals from only the selected one or more REGs and not from any non-selected REGs during a main scan; and
reconstructing an image from the obtained MR signals.

19. The method of claim 18, wherein the main scan is a first main scan of a first region of an imaging subject, wherein the first sensitivity maps and second sensitivity maps are generated from low resolution data acquired during a first calibration scan of the first region performed before the first main scan, and further comprising:
responsive to a command to perform a second main scan of a second region of the imaging subject, performing a second calibration scan of the second region of the imaging subject;
generating third sensitivity maps from low resolution calibration data acquired during the second calibration scan;
selecting one or more REGs based on the third sensitivity maps and a new ROI; and
obtaining MR signals from only the one or more REGs selected based on the third sensitivity maps and new ROI and not from any non-selected REGs during the second main scan.

* * * * *